US008916311B2

(12) United States Patent
Yates et al.

(10) Patent No.: US 8,916,311 B2
(45) Date of Patent: Dec. 23, 2014

(54) ION/PROTON-CONDUCTING APPARATUS AND METHOD

(75) Inventors: Matthew Yates, Fairport, NY (US); Wei Xue, Rochester, NY (US)

(73) Assignee: University of Rochester, Rochester, NY (US)

(*) Notice: Subject to any disclaimer, the term of this patent is extended or adjusted under 35 U.S.C. 154(b) by 674 days.

(21) Appl. No.: 13/213,566

(22) Filed: Aug. 19, 2011

(65) Prior Publication Data

US 2012/0040269 A1 Feb. 16, 2012

Related U.S. Application Data

(60) Continuation-in-part of application No. 13/083,737, filed on Apr. 11, 2011, now Pat. No. 8,129,072, which is a division of application No. 12/392,150, filed on Feb. 25, 2009, now Pat. No. 7,943,269.

(60) Provisional application No. 61/031,492, filed on Feb. 26, 2008, provisional application No. 61/101,314, filed on Sep. 30, 2008.

(51) Int. Cl.
| | |
|---|---|
| *H01M 8/10* | (2006.01) |
| *B05D 5/12* | (2006.01) |
| *C30B 29/14* | (2006.01) |
| *H01M 8/12* | (2006.01) |

(52) U.S. Cl.
CPC ............ *C30B 29/14* (2013.01); *H01M 8/1004* (2013.01); *H01M 2008/1293* (2013.01); *Y02E 60/521* (2013.01); *Y02E 60/525* (2013.01); *H01M 2300/0068* (2013.01); *H01M 8/1016* (2013.01)
USPC .......................... 429/491; 423/308; 427/115

(58) Field of Classification Search
USPC ................. 429/479, 481, 482, 491, 495, 465; 427/126.1–126.3, 115, 2.27; 423/308
See application file for complete search history.

(56) References Cited

PUBLICATIONS

Wei, Xue. Microstructured Electrolyte Membranes to Improve Fuel Cell Performance, Dissertation, University of Rochester 2011.*

* cited by examiner

*Primary Examiner* — Carlos Barcena
(74) *Attorney, Agent, or Firm* — William Greener; Bond, Schoeneck & King, PLLC

(57) ABSTRACT

A c-axis-oriented HAP thin film synthesized by seeded growth on a palladium hydrogen membrane substrate. An exemplary synthetic process includes electrochemical seeding on the substrate, and secondary and tertiary hydrothermal treatments under conditions that favor growth along c-axes and a-axes in sequence. By adjusting corresponding synthetic conditions, an HAP this film can be grown to a controllable thickness with a dense coverage on the underlying substrate. The thin films have relatively high proton conductivity under hydrogen atmosphere and high temperature conditions. The c-axis oriented films may be integrated into fuel cells for application in the intermediate temperature range of 200-600° C. The electrochemical-hydrothermal deposition technique may be applied to create other oriented crystal materials having optimized properties, useful for separations and catalysis as well as electronic and electrochemical applications, electrochemical membrane reactors, and in chemical sensors. Additional high-density and gas-tight HAP film compositions may be deposited using a two-step deposition method that includes an electrochemical deposition method followed by a hydrothermal deposition method. The two-step method uses a single hydrothermal deposition solution composition. The method may be used to deposit HAP films including but not limited to at least doped HAP films, and more particularly including carbonated HAP films. In addition, the high-density and gas-tight HAP films may be used in proton exchange membrane fuel cells.

10 Claims, 34 Drawing Sheets

(a)                   (b)                   (c)

ION/PROTON-CONDUCTING APPARATUS AND METHOD

RELATED APPLICATION DATA

The instant application is a continuation-in-part (CIP) of U.S. non-Provisional application Ser. No. 13/083,737, filed on 11 Apr. 2011, which in turn is a divisional application of U.S. non-provisional application Ser. No. 12/392,150, filed on 25 Feb. 2009, now U.S. Pat. No. 7,943,269, which in turn claims priority to U.S. Provisional application Ser. No. 61/031,492 filed on Feb. 26, 2008 and to U.S. Provisional application Ser. No. 61/101,314 filed on Sep. 30, 2008, the subject matters of which are hereby incorporated by reference in their entireties.

FEDERALLY SPONSORED RESEARCH

This invention was made with government support under Contract Nos. DE-FG02-05ER15722 and DE-FC03-92SF19460 awarded by the United States Department of Energy, and under Contract No. CMMI-0856128 awarded by the National Science Foundation (NSF). The government has certain rights in the invention.

BACKGROUND

1. Field of the Invention

Embodiments of the invention pertain generally to the field of ion and/or proton conducting membranes. More particularly, embodiments of the invention are directed to ion and/or proton conducting membranes, devices incorporating ion and/or proton conducting membranes, methods of fabrication of ion and/or proton conducting membranes and devices incorporating same, and applications for said membranes, particularly, but not limited to, fuel cells, gas sensors, and electrocatalytic devices.

2. Description of Related Art

Ion conducting membranes are used in fuel cells, electrochemical membrane reactors, and in chemical sensors. In these exemplary applications, the membrane is electrically insulating but is conductive to protons or oxygen ions. In fuel cells, the membrane performance largely determines the fuel cell operating conditions and, as a result, the design of the entire fuel cell device. The two most common classes of fuel cells are polymeric electrolyte membrane fuel cells (PEMFCs) and solid oxide fuel cells (SOFCs). The ion exchange membranes in PEMFCs are polymers that function most effectively below 100° C. There are no polymeric ion conducting membranes reported that operate effectively above 200° C. The upper temperature limit on polymeric ion conducting membranes means that expensive platinum catalysts should be used for the oxidation and reduction reactions in fuel cells.

The ion exchange membranes in SOFCs are ceramics that operate most effectively at temperatures above 700° C. The temperature is high enough to allow non-precious metal catalysts to be effective for the oxidation and reduction reactions in fuel cells. However, the SOFC operating temperature is sufficiently high that stress from thermal cycles can, and often does, lead to device failure.

There is currently significant interest in developing effective and commercially viable ion conducting membranes that can be used in an intermediate temperature range between about 200-600° C. The discovery of an effective intermediate temperature ionic conducting membrane could truly revolutionize the fuel cell industry. The intermediate temperature range of 200-600° C. would be low enough to allow fuel cell construction using low cost materials, but high enough to use non-precious metal catalysts and allow internal fuel reforming of hydrocarbon fuels.

Previous approaches to creating membranes suitable for the intermediate temperature range have focused on either finding new ion conductors with higher conductivity, or making existing membranes thinner to reduce overall resistance.

Ito et al., "New Intermediate Temperature Fuel Cell with Ultra-Thin Proton Conductor Electrolyte" *J. Power Sources* 2005, vol. 152, pp. 200-203) report a fuel cell that uses an ultrathin proton conducting ceramic membrane deposited onto a palladium foil hydrogen membrane, which is then coated with a perovskite ceramic cathode. They referred to this three-layer structure as a "hydrogen membrane fuel cell" or HMFC, as generically illustrated in FIG. 1. The palladium foil simultaneously serves as the fuel cell anode and as a hydrogen membrane. Hydrogen dissolves into the palladium in the form of protons and electrons. The protons travel through the palladium foil and then through the proton conducting ceramic. Since the proton conducting ceramic is electrically insulating, the electrons are forced to travel from the palladium through an external circuit to the cathode, thereby generating electricity. The reported HMFC used $BaCe_{0.8}Y_{0.2}O_3$ as the proton conducting ceramic, a material known to exhibit purely protonic conductivity below 600° C. The reported performance of the HMFC demonstrated a maximum power density of 0.9 W/cm$^2$ at 400° C. and 1.4 W/cm$^2$ at 600° C. The HMFC was designed to minimize the overall resistance of $BaCe_{0.8}Y_{0.2}O_3$ to proton conduction by making the membrane as thin as possible. The ultra-thin $BaCe_{0.8}Y_{0.2}O_3$ ceramic membrane (~700 nm thickness) was supported by the palladium foil and would be too fragile to be self-supporting.

One significant limitation in the HMFC described above is the use of pulsed laser deposition to create the thin film of ceramic on palladium. Pulsed laser deposition is a high vacuum technique that is known to be unsuitable for economically coating large surface areas (the reported HMFC was in the shape of a circle only six millimeters in diameter). The pulsed laser deposition technique is also difficult to employ to coat non-planar substrates.

Zeolite and molecular sieves have been reported in which mass transport occurs through pores in the crystalline framework of the material. This work has not been extended to ion or proton conduction.

Hydroxyapatite ($Ca_{10}(PO_4)_6(OH)_2$, or "HAP") is one type of calcium phosphate crystals. HAP crystals have a hexagonal crystallographic structure and Ca/P molar ratio of 1.67 for the stoichiometric crystals. The hexagonal apatite crystal structure in HAP has been shown to be thermally stable up to 1400° C. High temperature electrochemical investigations have indicated that HAP is proton conductive, with the mechanism of conduction hypothesized to be migration of protons along hydroxyl groups lining the c-axis of the crystals. Since proton conduction occurs primarily along one crystal axis (c-axis) in HAP, it is expected that conductivity will be strongly anisotropic in a single crystal. However, there is no reported study to date of high temperature proton conductivity in singe crystals of HAP due to the difficulty to synthesize large-sized HAP single crystals.

Ban et al., "Hydrothermal-Electrochemical Deposition of Hydroxyapatite", *J. Biomed. Mater. Res.*, 42, pp. 387-395 (1998) and Ban et al. "Morphological Regulation and Crystal Growth of Hydrothermal-Electrochemically Deposited Apatite", *Biomaterials*, 23, pp. 2965-2972 (2002) have reported electrochemical/hydrothermal synthesis of thin films of hydroxyapatite on titanium and stainless steel electrodes to make the metal surfaces biocompatible for orthopedic implants. Similar synthesis of hydroxyapatite crystals onto palladium-based hydrogen membranes, useful for fuel cell applications, has not been reported. Electrochemical growth onto palladium membranes is particularly challenging due to hydrogen embrittlement. Embrittlement refers to the membrane warping and damage that occurs when pure palladium is exposed to hydrogen at temperatures below 293° C. The use of palladium alloys rather than pure palladium mitigates warping to some extent, but does not eliminate issues of hydrogen embrittlement. During hydrothermal-electrochemical synthesis, hydroxyapatite nucleation and growth is driven by a local increase in pH near the cathode that accompanies electrolysis of water. As a result, hydroxyapatite grows only on the cathode, not the anode. Since hydrogen gas is evolved at the cathode during electrolysis, the hydroxyapatite cannot be electrochemically deposited without exposing the palladium membrane directly to hydrogen gas.

In view of the foregoing discussion and the known shortcomings of current technology, the inventors have recognized that improvements to the current state of the art and solutions to the known problems in the art will be beneficial and advantageous. These improvements and solutions will be set forth in the following description of embodiments of the invention, the figures, and as recited in the appended claims.

SUMMARY DISCUSSION

An embodiment of the invention is directed to an ion-/proton-conducting membrane. The membrane has selectively oriented crystal c-axes that facilitate (and are intended to optimize) ion/proton transport. Compared to current ceramic membranes, the membrane is relatively thin and has single crystal domains spanning the membrane thickness. The membrane is also sufficiently dense to provide a gas-tight barrier. By optimizing proton transport, a fuel cell incorporating such a membrane should operate at lower temperatures than is currently possible with standard ceramic membranes. In a non-limiting aspect, the film is apatite crystals. In a more particular aspect, HAP is the ion-/proton-conducting material. Alternative crystalline ion-/proton-conducting materials may include, but are not limited to, zirconia, yttrium stabilized zirconia, lanthanum gallates, cerium dioxide, bismuth oxides, lanthanum-molybdenum oxides, brownmillerite, perovskite aluminates, apatite-type silicates, fluorite-type oxides, barium cerates, barium titanates, and strontium cerates. The ion/proton conducting membrane further comprises a substrate. According to a non-limiting aspect, the substrate is palladium. Alternatively, the substrate may be a palladium alloy or nickel, or a non-metallic (e.g., ceramic) material. In an aspect, the substrate may be removable; i.e., a sacrificial substrate.

An embodiment of the invention is directed to a hydrogen fuel cell. If the hydroxyapatite film on palladium (or nickel, for example) is coated with an electrically conducting cathode layer, the resulting structure will be a hydrogen membrane fuel cell. The fuel cell includes an anode, a cathode, and an ion-/proton-conducting membrane disposed between the anode and the cathode, wherein the ion-/proton-conducting membrane further comprises a hydroxyapatite (HAP) thin film having a thickness t. The HAP thin film is characterized by a plurality of single HAP crystals each having its c-axis oriented normal to the substrate in the form of a gas tight film, further wherein each of the single HAP crystals has a crystal domain that substantially spans the film thickness t. According to an exemplary aspect, the cathode material is $Ba_{0.5}Sr_{0.5}Co_{0.8}Fe_{0.2}O_{3-\delta}$ (BSCF), a ceramic with very good performance as a fuel cell cathode in the temperature range of 500-700° C. Synthesized BSCF powder can be converted into a paste that can be painted onto, or otherwise applied to, an ion conducting ceramic and sintered to form a fuel cell cathode layer. Possible alternative intermediate temperature cathode materials include other perovskite ceramics such as LaSrCoFeO, lithiated nickel oxides such as $Li_xNiO_{2+}$ (x=0.05-1.0), or other metal oxides with or without lithiation. The fuel cell will exhibit a proton conductivity equal to or greater than 1E-6 S/c over a temperature range between about 300° C. to 900° C. and, in an aspect will operate in the temperature range of 300° C.-600° C. An exemplary device will be a new type of fuel cell membrane based on ion conduction through single crystals aligned to maximize proton transport.

An embodiment of the invention is directed to a method for making an ion-/proton conducting membrane. The method includes the steps of creating a seeded surface by depositing a sufficiently dense HAP seed layer on a hydrogen membrane cathode electrode, hydrothermally synthesizing a c-axis-oriented, crystalline HAP film on the seeded surface in a secondary, single crystallization substantially normal to the seeded surface, and hydrothermally densifying the HAP film in an a-axis orientation perpendicular to the c-axis orientation in a tertiary crystallization to form a gas-tight thin film. In a non-limiting aspect, the seed layer is electrochemically directly grown on a pure palladium hydrogen membrane cathode electrode. By optimizing proton transport, fuel cells may have improved performance and be operated at lower temperatures than possible with standard ceramic membranes. In addition, by growing the proton conducting membrane electrochemically directly onto hydrogen membranes, the proton conductor can easily and inexpensively be coated onto large surface areas and onto tubular geometry often used for hydrogen membranes. According to an aspect of the method, palladium embrittlement can be mitigated by reducing an amount of evolved hydrogen at the cathode electrode. This may be accomplished by applying an electrical current equal to or less than 10 mA/cm² and/or limiting the deposition time to between about five minutes to one minute. According to an aspect, the method involves controlling supersaturation of HAP to mediate crystal nucleation and growth to achieve thin film densification and/or to control the resulting thickness of the thin film; advantageously, controllably reducing the film thickness from about 10 µm to 1-2 µm or less.

Additional embodiments include methods for depositing a HAP film upon a substrate to provide a high-density gas-tight HAP film upon the substrate as evidenced and characterized by the presence of substantially only a (002) peak within a 2Θ x-ray diffraction spectrum of the HAP film in a range from +/−20 to 40 degrees. The additional methods in accordance with the additional embodiments comprise: (1) an electrochemical deposition method that uses an electrochemical deposition solution composition for forming a HAP seed layer upon the substrate; in conjunction with (2) a hydrothermal deposition method that uses a single hydrothermal deposition solution composition to form the high-density gas-tight HAP film upon the substrate from the HAP seed layer upon the substrate. Within the single hydrothermal deposition solution composition, relative concentrations of at least a calcium source material and a phosphorus source material are controlled to provide the high-density gas-tight HAP film upon the substrate.

Additional embodiments also include particular doped HAP films deposited in accordance with the foregoing additional methods, as well as a proton exchange membrane hydrogen fuel cell that includes the particular doped HAP films within a proton exchange membrane.

While not wishing to be bound by any particular theory of operation of the embodiments, it is believed that electrostatic interactions between source material and specific HAP crystal surfaces are relevant for promoting or retarding an a-axis growth and a b-axis growth (i.e., in a plane of the substrate) in comparison with a c-axis growth (i.e., perpendicular to the plane of the substrate) when depositing the high-density gas-tight HAP film upon the substrate including the HAP seed layer while using the hydrothermal deposition method in accordance with the embodiments.

A particular film composition in accordance with the additional embodiments includes a crystalline proton and/or ion conducting film having a thickness, wherein the crystalline proton and/or ion conducting film is characterized by a plurality of single carbonated apatite crystals each having a c-axis normal to a surface of the film composition, further wherein the film composition is a gas-tight film composition where each of the plurality of single carbonated apatite crystals has a crystal domain that substantially spans the thickness of the crystalline proton and/or ion conducting film.

A particular fuel cell in accordance with the additional embodiments includes an anode separate from a cathode. The fuel cell also includes a crystalline proton and/or ion conducting film interposed between the anode and the cathode and having a thickness, wherein the crystalline proton and/or ion conducting film is characterized by a plurality of single carbonated apatite crystals each having a c-axis normal to a surface of the film composition, further wherein the film composition is a gas-tight film composition where each of the plurality of single carbonated apatite crystals has a crystal domain that substantially spans the thickness of the crystalline proton and/or ion conducting film.

A particular method for forming a hydroxyapatite film in accordance with the additional embodiments includes forming upon a substrate a hydroxyapatite seed layer. The method also includes forming upon the substrate and the hydroxyapatite seed layer a gas-tight hydroxyapatite film while using a hydrothermal deposition method that uses a single hydrothermal deposition solution composition.

DETAILED DESCRIPTION OF EXEMPLARY EMBODIMENTS OF THE INVENTION

Figure 1:
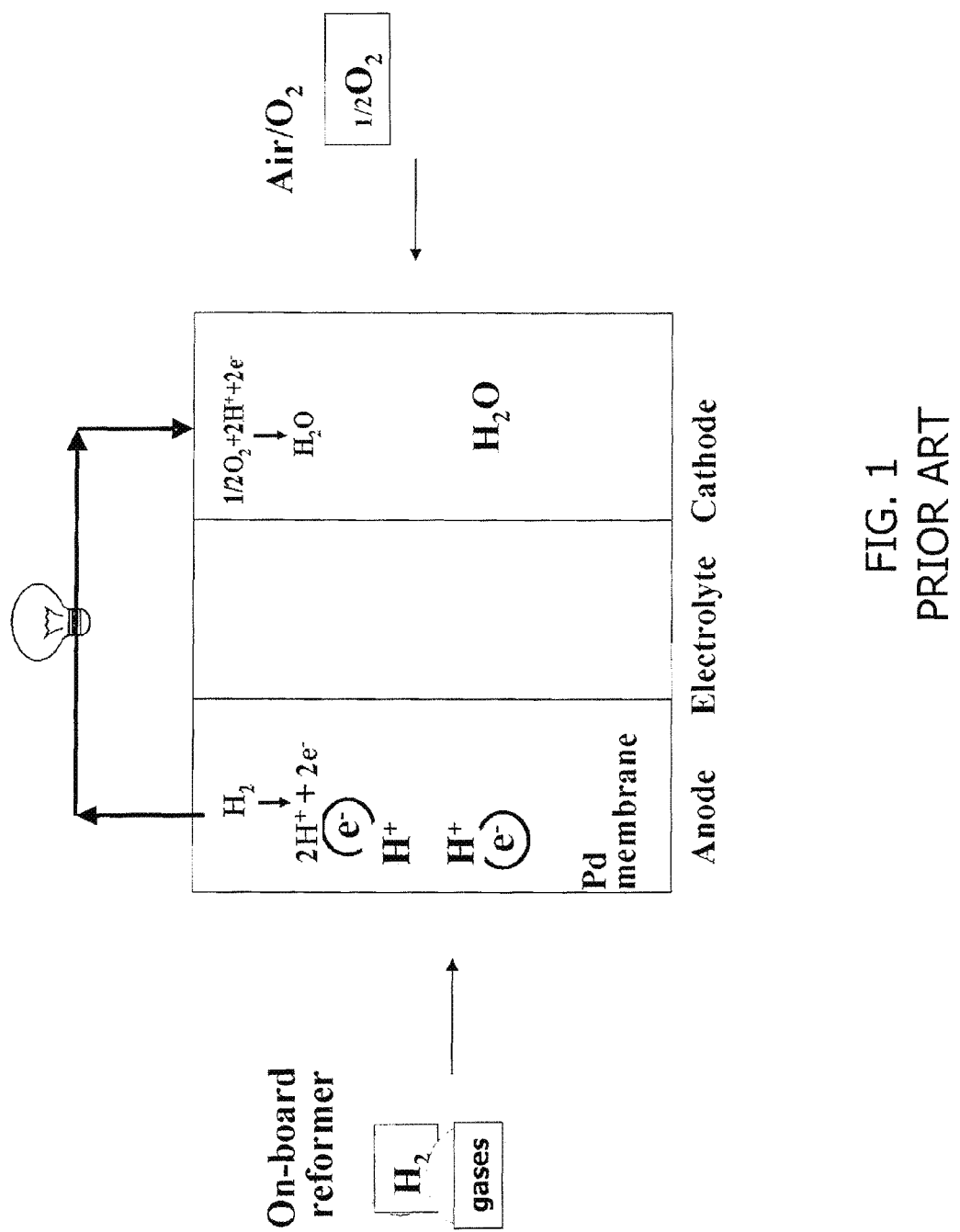
FIG. 1 schematically shows a generic hydrogen membrane fuel cell as known in the art.
Figure 2:
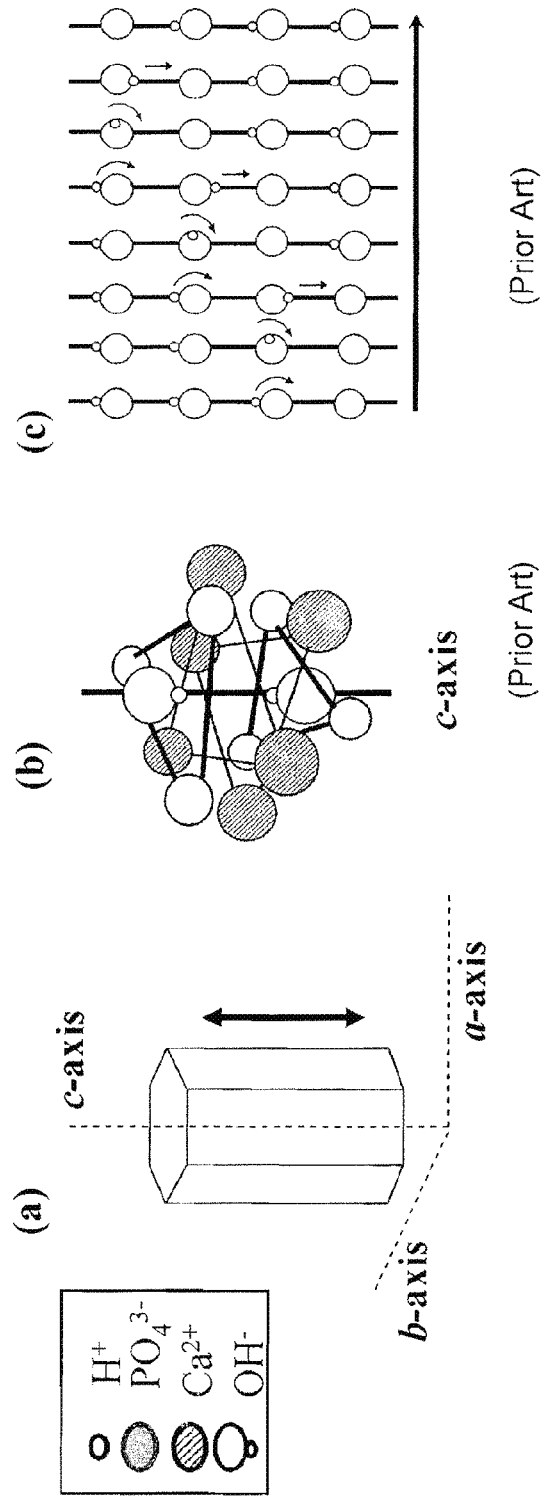
FIG. 2 schematically illustrates (a) the typical shape of a HAP single crystal, (b) the atomic environment around OH—ions, and (c) proton transportation along the c-axis of the HAP crystal.

As mentioned above, optimal performance of a hydroxyapatite ion-/proton-conducting membrane occurs when the crystal domains span the entire thickness of the membrane to eliminate grain boundary resistance across the thickness of the crystal. In addition, the crystal's c-axis would be aligned so that the proton transport path is optimized, as illustrated in FIGS. 2(a-c).

Figure 3:
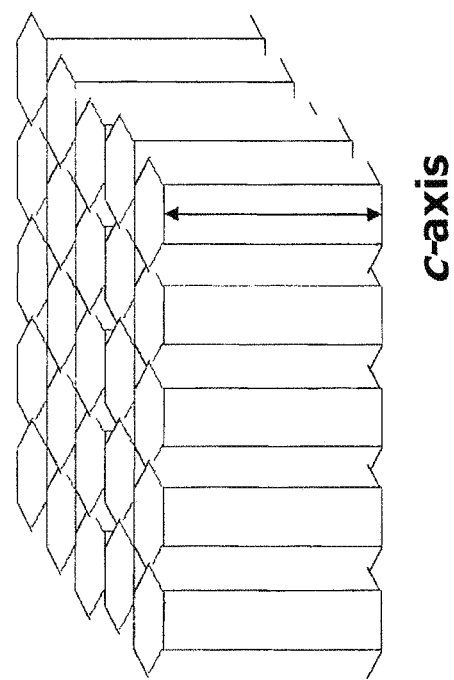
FIG. 3(a) schematically illustrates a randomly oriented HAP crystal membrane structure.
FIG. 3(b) schematically illustrates an ideal HAP membrane structure with the c-axes of crystal domains spanning the entire membrane thickness to optimize proton transport.
Figure 3:
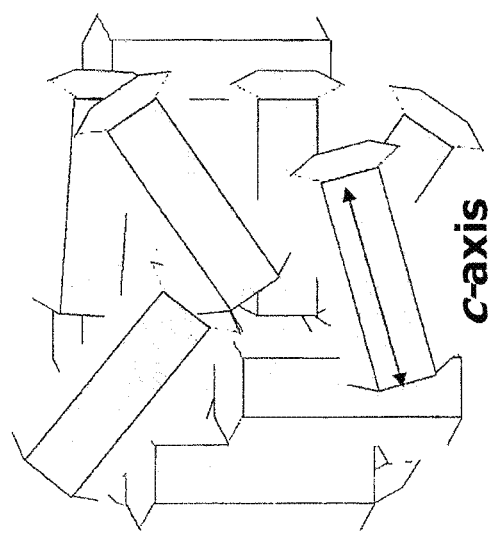
Figure 4:
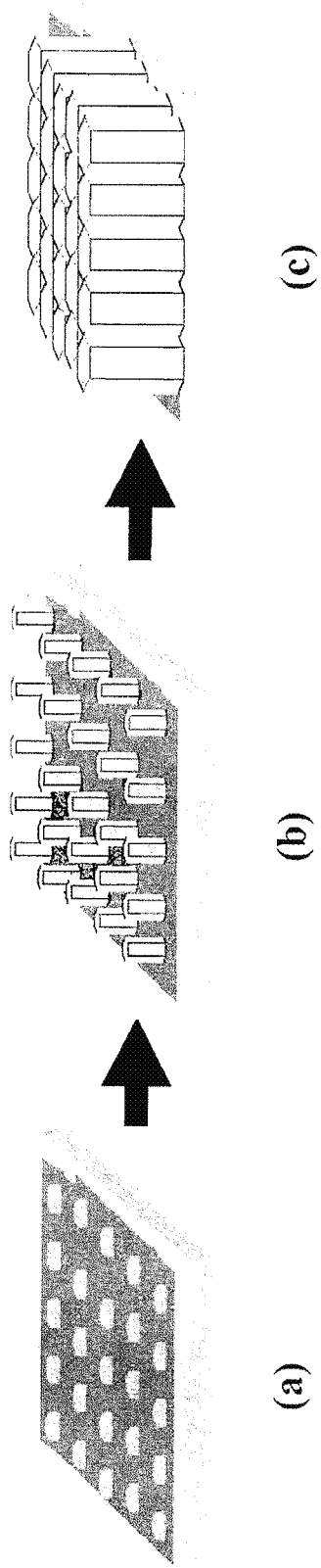
FIG. 4 schematically shows (a) Seeding: an electrochemical seed deposition of HAP on a Pd substrate; (b) Secondary growth: hydrothermal deposition under conditions that favor c-axis growth to yield oriented columnar crystals; (c) Tertiary growth: hydrothermal deposition under conditions that favor a-plane growth to obtain oriented, dense (gas-tight) crystalline films, according to an illustrative embodiment of the invention.
Figure 8:
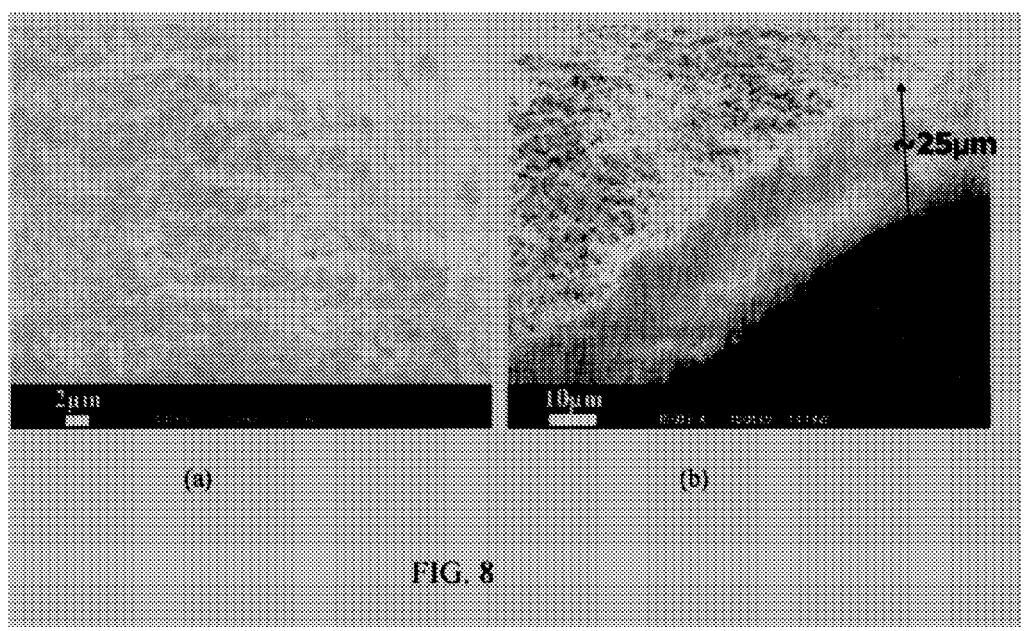
FIG. 8a is a top-view SEM image of tertiary growth of HAP crystals on a Pd membrane.
FIG. 8b is a side-view SEM image of FIG. 8a, according to an illustrative embodiment of the invention.
Figure 13:
FIGS. 13(a-d) show SEM images of HAP seed layers on a palladium substrate prepared by electrochemical deposition at 9.5 mA/cm$^2$ current density in (a) 2 minutes and (b) 1 minute; (c) and (d) show the morphology of HAP films after tertiary hydrothermal synthesis grown from the seed layer (a) and (b), respectively, according to an illustrative aspect of the invention.
Figure 13:
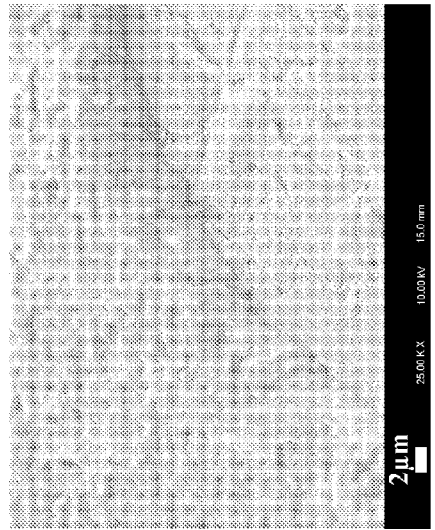
Figure 13:
Figure 13:
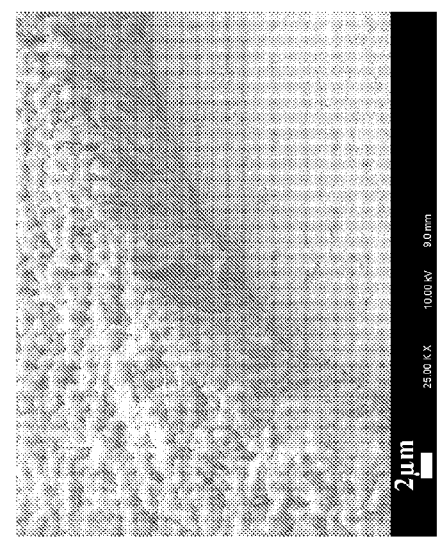

FIG. 3(a) schematically shows HAP crystals that are randomly oriented. FIG. 3(b), on the other hand, schematically shows an ideal HAP membrane structure with the c-axes of crystal domains spanning the entire membrane thickness to optimize proton transport;

A non-limiting, exemplary ion/proton conducting membrane 400-1 as illustrated in FIG. 4(c) includes a substrate 402 and a crystalline ion-conducting thin film 304 (also shown in FIG. 3(b)) having a thickness t. The thin film is characterized by a plurality of single apatite crystals 304' each having its c-axis oriented normal to the substrate (as also shown in FIG. 8(b) and FIGS. 13(a-c)). The apatite film is grown sufficiently dense (as described in more detail below) to form a gas-tight film (see, e.g., FIGS. 8(a, b). Each of the single crystals has a crystal domain that substantially spans the film thickness t as illustrated in FIG. 3(b).

According to an aspect, the hydroxyapatite membrane is grown onto a palladium substrate. Two types of palladium substrates can be considered: thin foils and palladium deposited on porous supports. Palladium foils are currently commercially available in thicknesses as low as 25 µm. Palladium foils have smooth surfaces that make them attractive as model substrates for viewing hydroxyapatite crystal growth via electron microscopy. However, unsupported palladium foils are fragile. Bending of the palladium foil can cause the deposited hydroxyapatite layer to crack. For hydrogen membranes, palladium is often deposited onto porous supports comprised of stainless steel, nickel, ceramics, glass, or silicon. The porous support provides mechanical stability, allowing very thin palladium membranes to be used for gas separation. Thinner membranes save cost by reducing the amount of palladium required per unit surface area and improve mass transport of hydrogen by lowering membrane resistance. Porous stainless steel plates and tubes can advantageously be used as palladium supports. The palladium is deposited following well-established electroless deposition processes after sensitizing the surface of the porous stainless steel in acidic $PdCl_2$ and $SnCl_2$ solutions.

Figure 5:
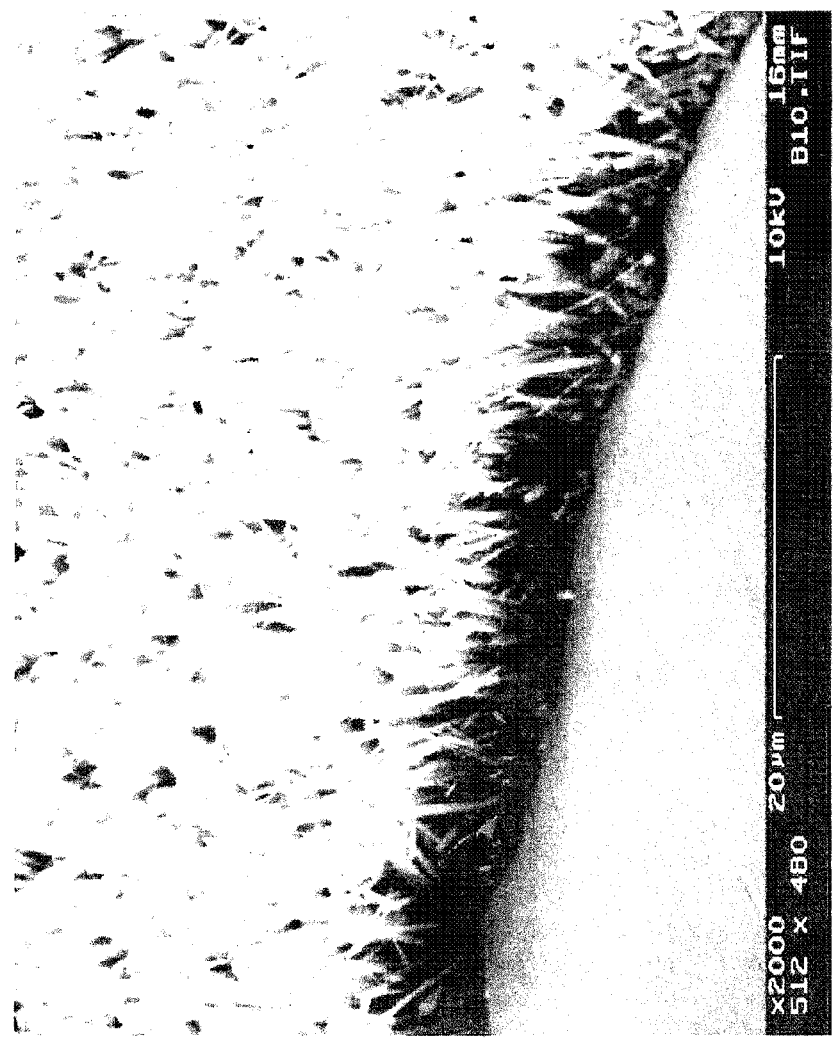
FIG. 5 is a side-view SEM image showing the morphology of HAP deposited onto a 50 μm thick palladium/silver (75/25) alloy, according to an illustrative embodiment of the invention.

Alternatively, the substrate may be a palladium alloy. FIG. 5 shows the morphology of HAP deposited onto a 50 µm thick palladium/silver 75/25 alloy foil. It can be seen that the c-axis crystal growth is normal to the substrate surface. Palladium/copper may also provide a suitable alloy.

In order to realize the ideal membrane structure illustrated in FIG. 4(c), "secondary growth" and "tertiary growth" processes are used, as illustrated in FIGS. 4(b), (c), respectively.

In both processes, a seed layer is first deposited to promote crystal growth on the surface as illustrated in FIG. 4(a). In the secondary growth process (FIG. 4(b)), a dense crystalline film is produced in a single secondary crystallization onto the seeded surface. In a tertiary growth process, the secondary crystallization step promotes c-axis growth normal to the substrate but does not necessarily result in a dense film. A tertiary crystallization step (FIG. 4(c)) is then applied to promote a-axis growth (the a-axis is perpendicular to the c-axis) to densify the film and form a gas-tight barrier. To develop an effective secondary and tertiary growth processes for hydroxyapatite, a seed layer must first be formed with good surface coverage. Methods are then used to control the crystallization kinetics, and adjust the growth rate of the crystal c-axis relative to the a-axis to grow a dense crystalline film onto the seed layer.

The following detailed description of seeding, secondary, and tertiary growth processes are exemplary, illustrative, demonstrative, and non-limiting.

I. Preparation of HAP Layers Upon Palladium Substrates Using Three Step Method

A. Preparation of HAP Seeds on Palladium Substrates

Palladium substrates were prepared by electroless plating of a thin layer of palladium onto porous stainless steel supports following a reported procedure. The porous stainless steel supports were cleaned with an alkaline solution in an ultrasonic bath at ~60° C. followed by a surface activation by successively immersing the supports in acidic baths of $SnCl_2$ and $PdCl_2$. The palladium deposition was then conducted by immersing the activated supports in a plating solution for approximately three hours. The plating procedure was repeated until a desired film thickness was obtained. Typically, the thickness of the plated palladium film was around 20 µm, which was thick enough to seal the pores at the surface of the porous stainless steel supports. The porous stainless steel support ensures the mechanical stability of the thin palladium membranes. Thin palladium film improves mass transport of hydrogen by lowering membrane resistance.

HAP seeds were deposited onto the palladium substrate surface via an electrochemical deposition process. First, the palladium substrate was washed with an industrial soap solution, ultrasonicated in ethanol/acetone (volume ratio=50:50) solvent for 30 min, and then rinsed with deionized water for use as a cathode electrode in the electrochemical deposition reaction. The anode electrode was a platinum plate (25 mm×25 mm×127 µm). The anode and cathode electrodes were fixed onto two pieces of Teflon® material plates and arranged face to face with a separation distance of 10 mm by Teflon pieces. The entire assembly was immersed in the electrolyte solution preheated in an oil-bath (~95° C.) for the HAP film growth. The electrolyte solution was prepared as described in the literature, consisting of 1.67 mM $K_2HPO_4$, 2.5 mM $CaCl_2$ and 138 mM NaCl in deionized water. The solution was buffered to pH 7.2 using tris(hydroxymethyl)-aminomethane and 37% hydrochloride acid. A constant current was generated with a direct current power supply and applied to the electrodes for a desired time. After the electrochemical deposition, the cathode palladium electrode seeded with HAP crystals was taken out of the electrolyte solution, rinsed with deionized water several times, and dried in air.

B. Secondary Growth of HAP

The palladium substrate covered with the HAP seed layer was placed in a Teflon-lined vessel (40 ml of internal volume) with the seed layer facing down and tilted up at approximately 45 degrees relative to the bottom of the vessel. The synthetic solution was prepared by dissolving $Na_2EDTA$ (0.20 M) and $Ca(NO_3)_2$ (0.20 M) in 15 ml deionized water, and $(NH_4)_2HPO_4$ (0.12 M) in the other 15 ml deionized water to form the calcium and phosphate source solutions. The two source solutions were mixed together after pH of each solution was raised to 10.0 with ammonium hydroxide. The synthetic solution was stirred at room temperature for about 20 minutes and then transferred into the Teflon-lined vessel to immerse the seed layer seated on the palladium substrate. The Teflon-lined vessel was sealed in a stainless steel autoclave and put into a convective oven for the hydrothermal synthesis for 15 hours at 200° C. and autogenous pressure. After the reaction, the autoclave was cooled to room temperature in the fume hood. The sample was taken out, rinsed with deionized water several times, and dried in air.

C. Tertiary Growth of HAP

The set-up for tertiary hydrothermal growth was the same as secondary growth except that the HAP-covered palladium substrate after secondary growth was positioned in the Teflon-lined vessel. The synthetic solution was prepared by dissolving $Na_2EDTA$ (0.20 M), $Ca(NO_3)_2$ (0.20 M), and cetylpyridinium chloride (0.02 M) in 15 ml deionized water sequentially at 40° C. under stirring to form a viscous clear calcium source solution with pH adjusted to 8.0 by ammonium hydroxide. The phosphate source solution with pH ~8.0 was prepared by dissolving $(NH_4)_2HPO_4$ in a second 15 ml container of deionized water. The two solutions were mixed together, forming the synthetic solution for the tertiary hydrothermal deposition. The tertiary growth was carried out for 60 hours at 200° C. and autogenous pressure. To keep sufficient calcium and phosphate ions for HAP film growth during the reaction, the synthetic solution was replaced with fresh solution after every 15 hours until a dense HAP crystalline film was obtained.

D. Product Characterization

The crystal structure of HAP was determined by X-ray powder diffraction (XRD) with Cu Kα radiation ($\lambda=1.5418$ Å). The integration time was 2 hours and the step size was 0.02 degrees/3 seconds. Images of particle morphology and elemental analysis of the products were obtained using a scanning electron microscope equipped with an energy dispersive x-ray (EDX) spectrometer. The Fourier transform infrared (FTIR) spectrum was recorded with a spectrophotometer in the range of 500-2000 cm$^{-1}$. The sample was measured with 32 scans at an effective resolution of 2 cm$^{-1}$. Proton conductivity measurements of the membranes were carried out using two-point probe alternating current impedance spectroscopy over a frequency range of 300 kHz to 0.1 Hz. The upper surface of the HAP film was sputter coated with ~300 nm of palladium/gold (60%/40%) alloy as electrode. The electrical platinum leads were attached to both sides of the membrane using platinum paint. The membrane was attached to the end of an alumina tube using ceramic adhesive with the HAP film facing outward. The tube was placed in a tube furnace for temperature control. To avoid palladium embrittlement, nitrogen was fed to the inside of the tube as it was heated. The gas flow was switched to hydrogen when the temperature reached 300° C. The membrane was heated stepwise with a ramp rate of 2° C./minute, with the membrane maintained at constant temperature for at least one hour prior to each conductivity measurement.

E. Results and Discussion

1. Seeding HAP on Palladium Membranes

Electrochemical deposition has been widely studied for coating HAP on titanium and titanium alloy substrates in the area of bioactive surface modification for orthopedic implants. Under appropriate synthetic conditions, an applied electric current causes a local increase in pH near the cathode with the formation of OH$^-$ in the electrolyte solution due to formation of hydrogen gas by the reduction of $H_2O$. The increased pH and accumulation of both $Ca^{2+}$ and $HPO_4^{2-}$ ions near the cathode result in the supersaturation of calcium phosphate salts in the solution. As a result, HAP nucleation and growth is driven by the supersaturation onto the cathode metal electrode with the c-axis of the crystal preferentially oriented normal to the electrode surface. A reported, typical recipe of electrochemical/hydrothermal synthesis of HAP films on titanium substrates uses constant current conditions of ~12.5 mA/cm$^2$ at temperatures of 100-200° C. for a period of ~1 hour.

The electrochemical deposition of HAP onto a palladium substrate has never been reported and is particularly challenging due to hydrogen embrittlement; i.e., the membrane warping and damage that occurs when pure palladium is exposed to hydrogen at temperatures below 293° C. Since hydrogen gas is evolved at the cathode during electrolysis and HAP grows only on the cathode, the HAP can not be electrochemically deposited without exposing the palladium membrane directly to hydrogen gas. Under typical synthetic growth conditions of HAP on a titanium substrate, palladium-based membranes are destroyed by hydrogen embrittlement. To minimize hydrogen embrittlement, a reduction in hydrogen production was obtained by applying a smaller electrical current (typically less than 10 mA/cm$^2$) and/or a shorter deposition time (less than 5 minutes), allowing the growth of an acceptable seed layer on the palladium substrate.

Figure 6:
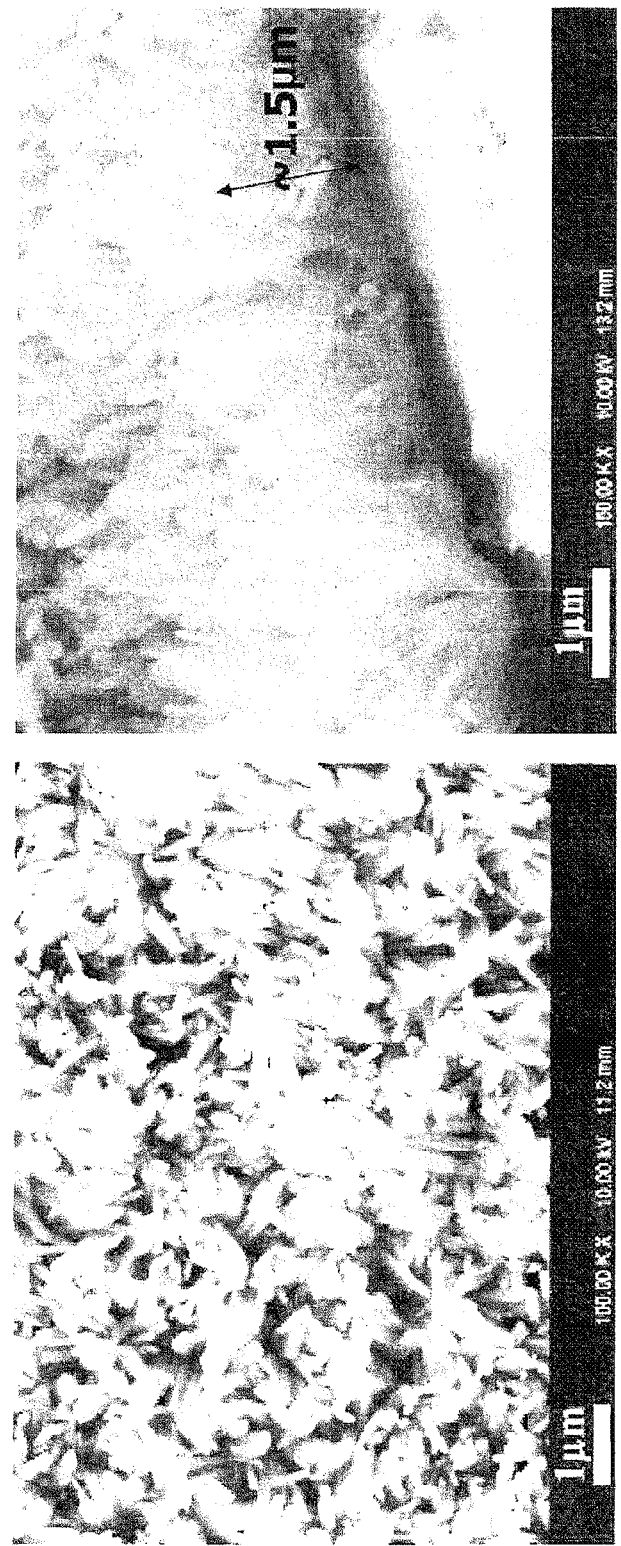
FIG. 6a is a top-view SEM image.
FIG. 6b is a side-view SEM image, showing HAP seeds grown on Pd membrane, according to an illustrative embodiment of the invention.

FIGS. 6(a, b) show an HAP seed layer with a porous structure on the underlying palladium substrate formed in 4 minutes at 95° C. with a current density of 9.5 mA/cm$^2$. The crystals in the seed layer typically have platelet morphology with a length of about 1-2 microns and a submicron width, as shown in FIG. 6(a). FIG. 6(b) indicates that the crystals preferentially orient normal to the palladium substrate. The X-ray diffraction pattern in FIG. 10(b) identifies the crystals as HAP, formed most likely from the plate-like octacalcium phosphate, a crystal phase that typically appears at low pH and within a certain temperature range in the electrochemical deposition of HAP. The strongest diffraction peak in FIG. 10(b) corresponds to (002) plane of the crystals, which demonstrates a (002) (i.e., c-axis) preferred orientation normal to the palladium substrate. Some HAP crystals also orient along other directions as indicated by the presence of several other diffraction peaks in FIG. 10(b). Typically, in a hexagonal HAP crystal, the cross-sectional surface, which is hexagonal in shape, is the c surface, which is parallel to the a-axis of the crystal unit cell. The six surfaces (rectangular in shape) occurring along the c-axis of the crystal unit cell are a surfaces (see FIG. 2a). The HAP seed layer promotes adhesion of the seed crystals to the underlying substrate and enhances secondary and tertiary growth of oriented HAP films at the substrate surface.

2. HAP Secondary Hydrothermal Growth

Hydrothermal synthesis with a mechanism of calcium chelate decomposition has been studied to grow large sized HAP crystals. A chelating agent, usually a carboxylic acid such as acetic acid, lactic acid, citric acid, and ethylenediamine tetraacetic acid (EDTA), is used to bind calcium ions to form a homogeneous phosphate-containing solution for the reaction. Upon heating the solution, the calcium carboxylate decomposes as the chemical equilibria shift and calcium is slowly and continuously released into the phosphate-containing solution. As the solution becomes supersaturated, calcium phosphate crystals progressively nucleate and grow. In other words, the crystal nucleation and growth are mediated with a controlled supersaturation by calcium chelating decomposition. Without the chelating agent, the solution would be supersaturated and the most stable calcium phosphate phase would spontaneously precipitate at the beginning of the reaction.

Figure 7:
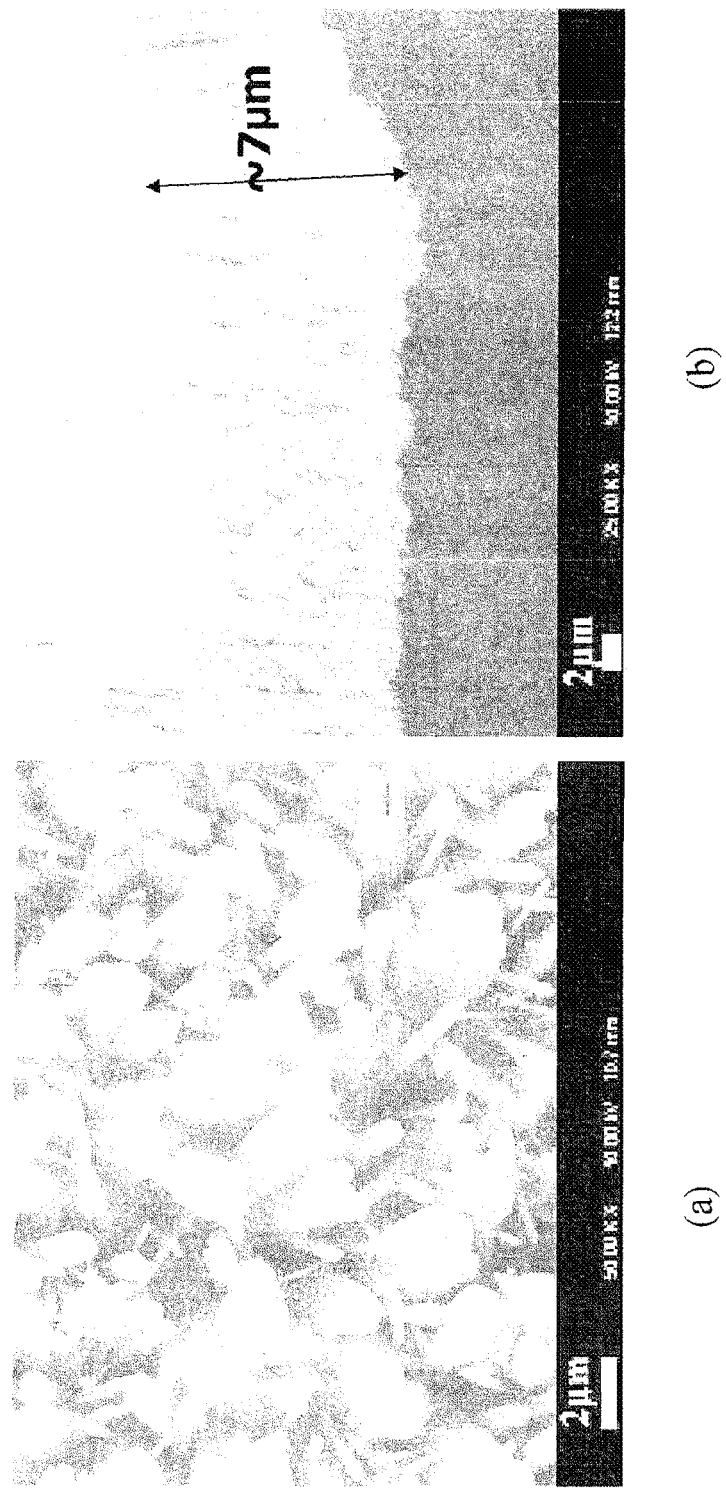
FIG. 7a is a top-view SEM image of secondary growth of HAP crystals on a Pd membrane.
FIG. 7b is a side-view SEM image of FIG. 7a, according to an illustrative embodiment of the invention.

FIGS. 7(a, b) and FIG. 10(c) show the surface and cross-sectional morphology, and XRD pattern, respectively, of an HAP crystal layer grown on a seeded palladium substrate after a secondary hydrothermal deposition in a calcium-$Na_2EDTA$ chelating solution. In FIG. 7(a), most crystals are rod-like in shape, having a well-defined hexagonal crystal habit with a width up to approximately 2 µm. The rod-shaped crystals orient perpendicular all the way down to the substrate with a length of approximately 7 µm, as shown in FIG. 7(b). The XRD pattern of the HAP film, illustrated in FIG. 10(c), shows a strong enhancement in intensity of (002) diffraction peak in comparison with shrinkage or disappearance of other diffraction peaks. The enhanced (002) intensity indicates that HAP crystals are c-axis oriented normal to the palladium substrate, consistent with the SEM observation in FIG. 7(b). The hexagonal surface is the c-surface of the crystals, as visualized in the top-view SEM image in FIG. 7(a). The six a-surfaces situating along the c-axis perpendicular to the c-surface of the crystals can be visualized in the side-view SEM image in FIG. 7(b).

The morphology and orientation of HAP crystals developed in the secondary hydrothermal growth are similar to those prepared by the hydrothermal-electrochemical deposition for a long deposition time on titanium substrates. The damage of palladium membrane due to hydrogen embrittlement, as discussed in HAP seeding step, prevents to grow large HAP crystals with purely electrochemical deposition process. The hydrothermal synthesis with a calcium chelate decomposition controls HAP supersaturation and promotes HAP growth with aligned c-axes on the seeded substrate surface rather than in the phosphate-containing solution. The seeded surface is important for the further growth of HAP into a denser crystalline film. A control experiment using unseeded palladium substrate was performed to investigate the effect of the seed layer. After the reaction, no uniform deposition was achieved, and only a few crystal aggregates consisting of rod-like HAP crystals radiating from a point in the form of a flower were separately deposited as islands on the surface of the substrate.

3. HAP Tertiary Hydrothermal Growth

Secondary hydrothermal growth of the seed layer (FIG. 7) yielded desired, highly c-axis-oriented rod-like crystals, but did not result in a dense HAP film. A tertiary growth step was used to promote lateral intergrowth of crystals to achieve a gas-tight HAP thin film. Synthesis of HAP has shown that HAP tends to form elongated whiskers along the c-axis of the crystal with well developed a-surfaces. Accelerating HAP growth along the a-axis direction (i.e., perpendicular to the c-axis) with developed c-surfaces results in crystals forming a dense, gas-tight thin film. Studies of HAP as a liquid chromatography packing indicate that HAP crystals have positively-charged a-surfaces and negatively-charged c-surfaces. The addition of oppositely-charged additives such as surfactants may result in electrostatic adsorption of molecules onto specific a- or c-surfaces to slow down or inhibit the crystal growth along one specific direction by mediating the crystal growth kinetics. To alter HAP growth preferentially along the a-axis direction, the cationic surfactant cetylpyridinium chloride was added in a tertiary hydrothermal growth of the HAP film.

Figure 10:
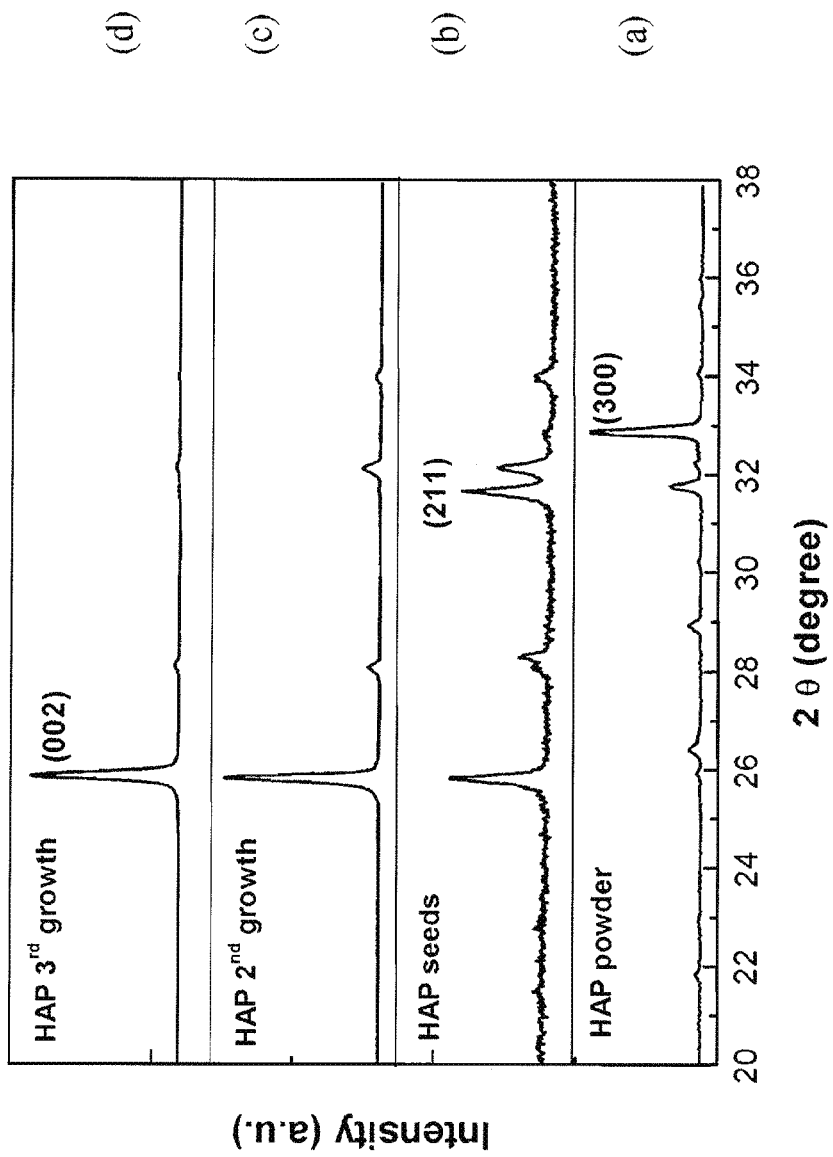
FIGS. 10(a-d) are X-ray diffraction (XRD) patterns of HAP seed and film layers in various growth processes, according to an illustrative embodiment of the invention.

FIGS. 8(*a, b*), and FIG. 10(*d*) show the morphology and XRD pattern, respectively, of an HAP film grown on the crystal layer by a tertiary hydrothermal growth. The HAP film appears as a dense and strongly adherent layer on the substrate. FIG. 8(*a*) is a top-view of the film that shows the crystal domains grown together over several microns, although some small gaps remain. The small gaps do not extend completely throughout (i.e., to the bottom of) the film, as visualized in the side-view SEM image in FIG. 8(*b*). The crystal film is oriented normal to the palladium substrate with a thickness of approximately 25 μm. The crystals in the film appear larger both in width and length than those after secondary growth, which indicates that HAP crystallization occurs along not only the a-axis direction, but also the c-axis direction in the tertiary deposition step. The rate of crystal growth in the a-axis direction is increased, while decreased in the c-axis direction, to form a dense, gas-tight film in the tertiary step. The crystal c-axis orientation is further verified with XRD characterization, as shown in FIG. 10(*d*). The peak corresponds to the (002) reflection plane. This confirms that during the tertiary treatment, HAP crystal growth follows the orientation of the original plate-like seeds in the seeding step and rod-like crystals in the secondary step, while the growth of mis-oriented crystals is minimal or nonexistent in the tertiary hydrothermal deposition.

Figure 9:
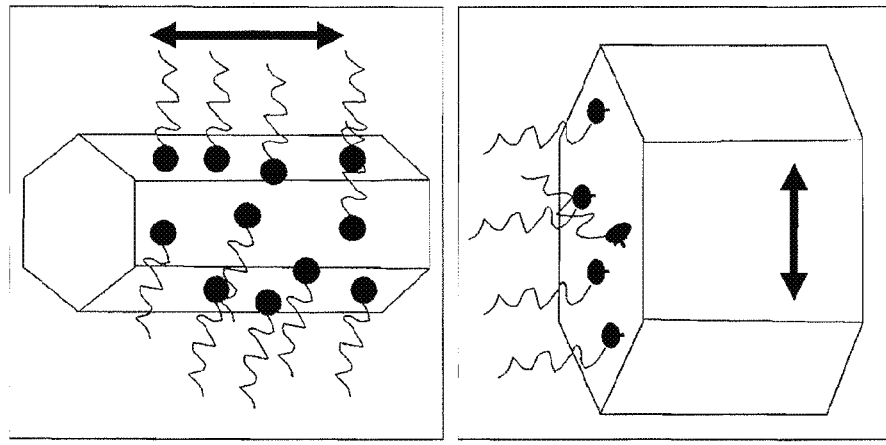
FIG. 9 schematically illustrates surfactants assist HAP growth along preferential c- or a-axis directions, according to an illustrative embodiment of the invention.
Figure 9:
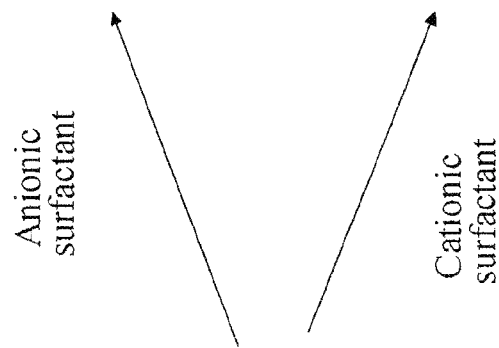
Figure 9:
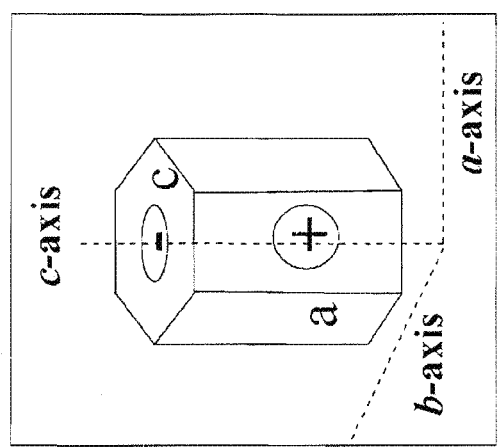

The foregoing SEM and XRD characterizations indicate that HAP crystals grow together with c-axes normal to the underlying palladium substrate. Cationic cetylpyridinium chloride most likely functions to assist crystal growth along a-axes. As schematically illustrated in FIG. 9, the positively charged surfactant is preferentially adsorbed to the negatively charged c-surfaces through electrostatic interactions. The adsorbed surfactant limits diffusion of the calcium and phosphate ions onto the c-surfaces to slow down growth along the c-axis direction. As a result, sufficient calcium and phosphate ions diffuse to the a-surfaces to accelerate growth along the a-axis direction, and finally to grow crystals together. The surfactant-assisted crystal growth into specific direction was previously investigated in the formation of novel rod-shaped calcite crystals with the longest crystal axis displaying (110) faces under the assistance of cetyltrimethylammonium bromide (CTAB) due to the adsorption of cationic CTAB onto the negatively charged (110) faces. To further verify the effect of cetylpyridinium chloride on the crystal growth, a control experiment to synthesize HAP film under the same conditions without addition of cetylpyridinium chloride was conducted. The result shows that individual crystals in the film grew longer than 25 microns, but many gaps between crystals were observed to extend down to the bottom of the film.

Figure 11:
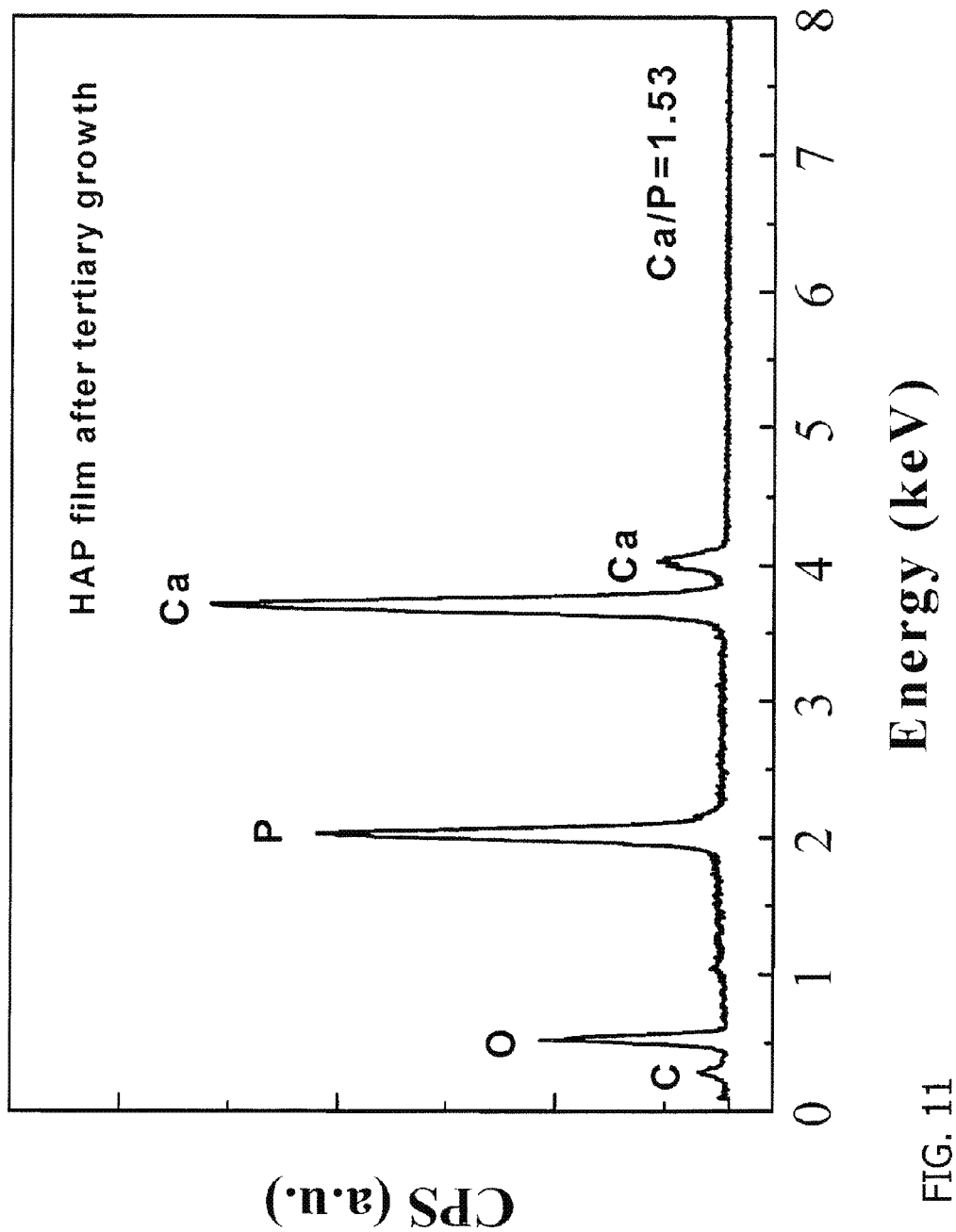
FIG. 11 shows an EDX spectrum of HAP film on a palladium substrate after tertiary hydrothermal growth, according to an illustrative aspect of the invention.
Figure 12:
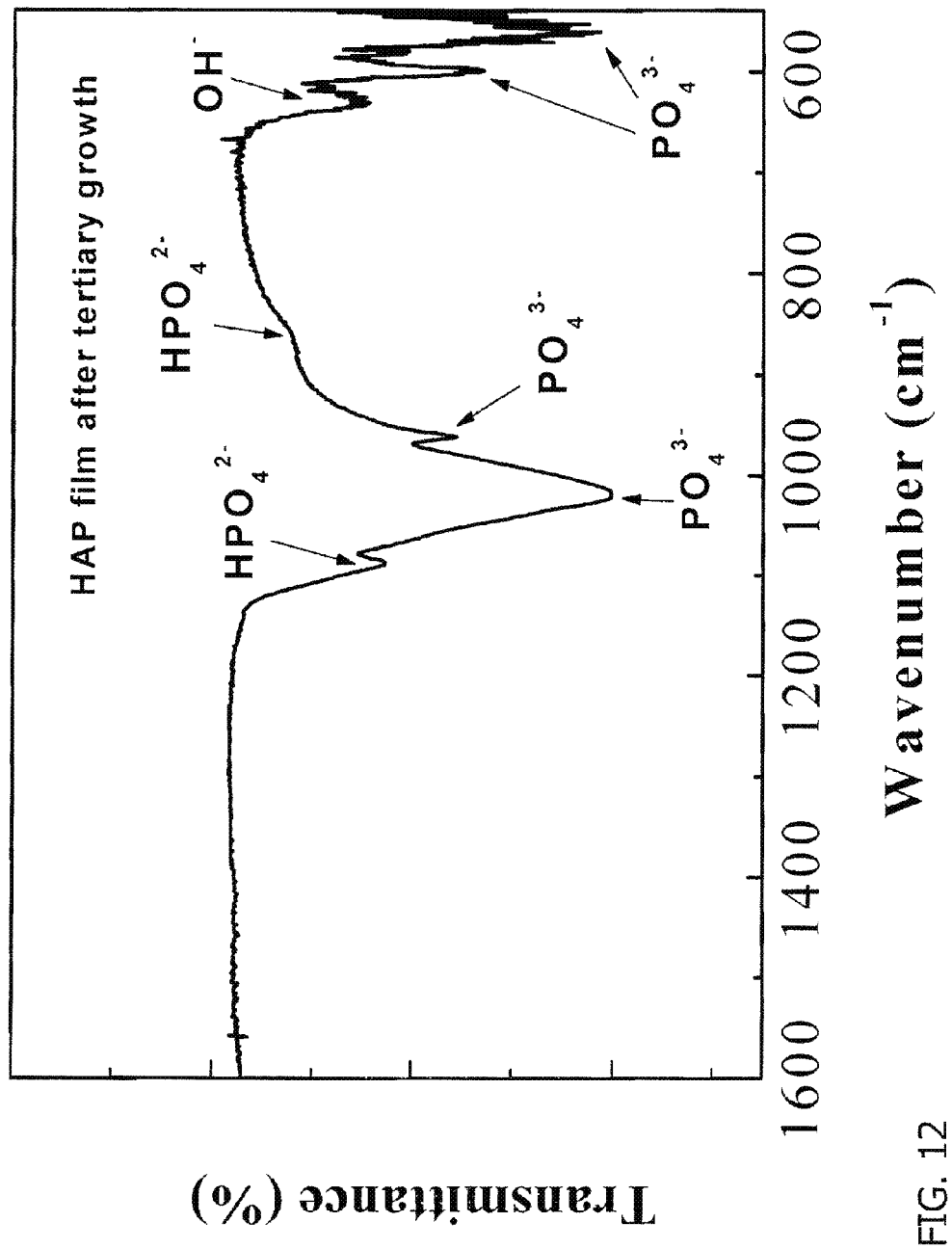
FIG. 12 shows an FTIR spectrum of HAP film on a palladium substrate after tertiary hydrothermal growth, according to an illustrative aspect of the invention.

The elemental composition and Ca/P ratio of the HAP films were studied with EDX spectroscopy, as shown in FIG. 11. The EDX spectrum is comprised of O, P and Ca peaks, confirming the presence of HAP. The C peak is likely from carbon tape used for the SEM observation. A semi-quantitative analysis of the EDX spectrum shows that the Ca/P atomic ratio is around 1.53, a little lower than the ideal stoichiometric value of 1.67. The nonstoichimetry (Ca deficiency) of HAP is consistent with reports from the literature for synthesis of micro-sized HAP crystals in hydrothermal reactions. The FTIR spectrum of the HAP film illustrated in FIG. 12 shows all absorption bands characteristic for HAP. The vibration of $OH^-$ groups appear at 632 $cm^{-1}$, whereas the internal modes corresponding to the $PO_4^{3-}$ groups centered at a range of wavenumbers can be clearly determined from the spectrum. Absence of any distinct bands in the range of 1400-1500 $cm^{-1}$ indicates that HAP does not contain large quantities of carbonate ions. The band observed at 870 $cm^{-1}$ is ascribed to the $HPO_4^{2-}$ groups, in agreement with data reported in the literature. The presence of $HPO_4^{2-}$ groups is consistent with the low Ca/P ratio in the synthesized HAP crystalline films.

4. HAP Films with Tunable Thickness

To make an effectively working fuel cell, a thin electrolyte membrane will advantageously reduce the electrolyte resistance. A typical thickness of the HAP membranes after the seeded growth is about 25 μm. A fuel cell HAP membrane film thickness will advantageously be less than 25 μm. According to an embodiment of the invention, membrane thickness can be reduced by using a shorter deposition time in the seed layer formation and/or a higher molar ratio of calcium to phosphate (or, lower phosphate concentration) in the hydrothermal depositions.

Figure 14:
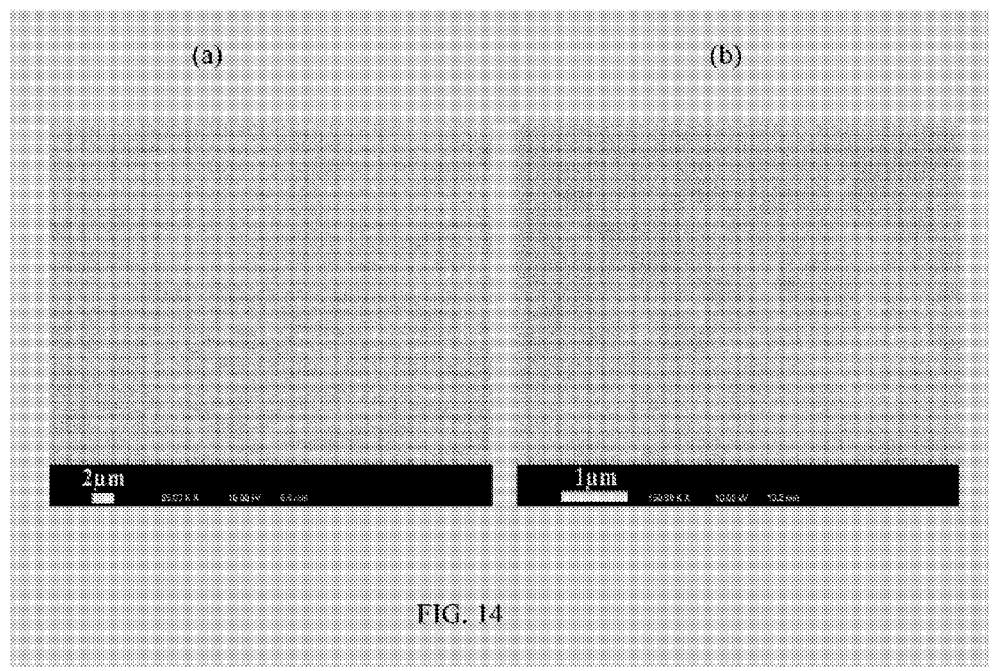
FIGS. 14(a, b) show top and bottom SEM images, respectively, of the surfaces of the HAP thin film shown in FIG. 13d, according to an illustrative aspect of the invention.

FIGS. 13(*a-d*) show SEM images of HAP seed layers on a palladium substrate prepared by electrochemical deposition at 9.5 mA/cm² current density in (*a*) 2 minutes and (*b*) 1 minute; (*c*) and (*d*) showing the morphology of HAP films after tertiary hydrothermal synthesis grown from the seed layer (a) and (b), respectively. As shown in FIGS. 13(*a, b*), the seed layer is about 300 nm and 600 nm thick when the electrochemical deposition time was 2 and 1 minutes, respectively. The secondary and tertiary hydrothermal synthesis using these two seeded surfaces occurred under conditions similar to grow approximately 25 μm thick films, except the phosphate concentration was reduced to 0.01 M from the original phosphate concentration of 0.06 M. After the reaction, the synthesized films were reduced to 5 and 2.5 μm thick, respectively, as shown in FIG. 13(*c, d*). The reduced film thickness is partially due to the thin seed layers produced in the electrochemical deposition. The reduced phosphate concentration may lower the degree of supersaturation of HAP in the reaction, and as a result alter the crystal growth habit by slowing down the crystal growth along the c-axis, and promoting the growth along the a-axis into a dense thin film. The HAP thin films still have a dense and continuous morphology on the surfaces of the approximately 2.5 μm thick films, as shown in FIG. 14. The top surface (FIG. 14a) indicates that there are some crystal domains, but all of them are grown together into a dense film. The bottom surface (FIG. 14b) is smooth and dense. A few small protrusions in the bottom surface result from the palladium substrate because the electroless-plated substrate is not perfectly flat and smooth.

5. Proton Conductivity of HAP Films

Figure 15:
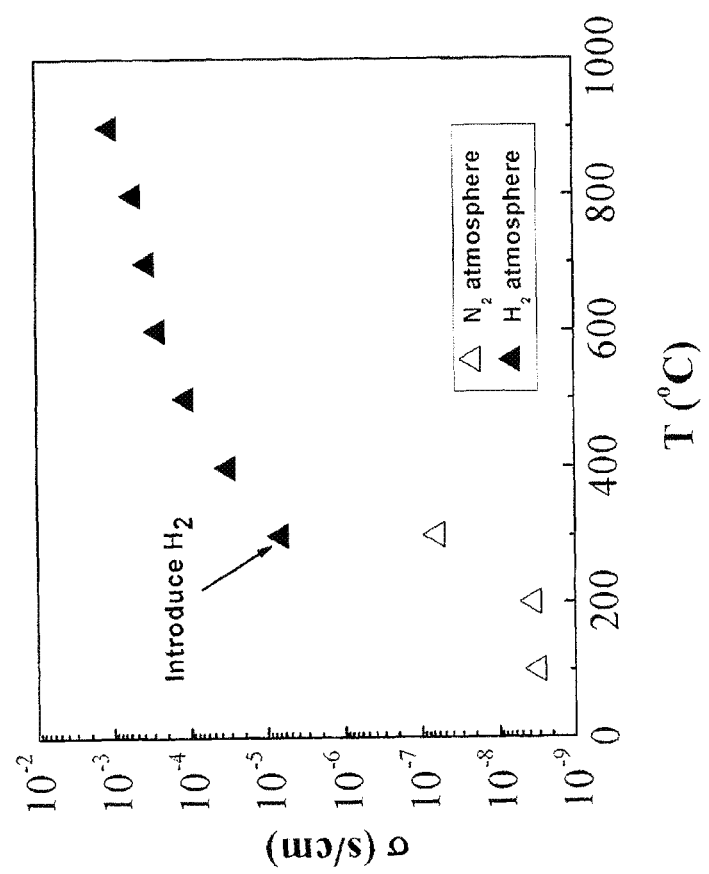
FIG. 15 graphically shows measured proton conductivity (a) of an HAP film, according to an illustrative aspect of the invention.

FIG. 15 shows proton conductivity of an HAP thin film on a palladium substrate prepared by the electrochemical and hydrothermal deposition processes described herein above. Electrical impedance spectroscopy was carried out to characterize the proton conductivity of the films. The measurement was conducted on an HAP film approximately 25 μm thick, similar to that shown in FIG. 8, created after seeded hydrothermal growth. FIG. 15 shows the resulting proton conductivity as a function of temperature up to 900° C. At 100-200° C., the measured conductivity was very low, approximately $10^{-9}$ S/cm. At 300° C., the conductivity was approximately $10^{-7}$ S/cm while nitrogen was being fed to the tube. The conductivity jumped to approximately $10^{-5}$ S/cm at 300° C. after switching to hydrogen flow into the tube. The enhancement of proton conductivity at 300° C. when the membrane was exposed to a hydrogen atmosphere is due to the injecting of protons from the palladium membrane to the HAP thin film. The injected protons increase the number of transporting protons in the crystalline membrane and, as a result, improve the membrane proton conductivity. The conductivity increased steadily with temperature above 300° C., reaching approximately $10^{-3}$ S/cm at 800° C., due to the c-axis-aligned crystal domains (it should be noted that interfacial resistance between the electrodes and the HAP may give a non-negligible contribution to the overall measured resistance because the film thickness is small (~25 μm)). In comparison, a traditional sintered HAP ceramic in dry air at 800° C. has a conductivity of approximately $5\times10^{-7}$ S/cm, nearly four orders of magnitude lower, suggesting that the HAP membrane with aligned crystal domains according to an embodiment of the invention may be capable of giving similar fuel cell performance.

Conductivity may further be increased by a) yttrium and b) fluorine substitution.

II Synthesis and SEM Characterization of Yttrium Substituted Hydroxyapatite (Y-HAP)

A. Preparation of Electrolyte

The electrolyte was prepared by adding 125 ml 50 mM tris(hydroxyl)aminomethane (Tris)(99.8+%, ACS reagent, Aldrich) into a 250 ml beaker, followed by adding 1.006 g sodium chloride (NaCl) (99+%, ACS reagent, Aldrich), 0.046 g calcium chloride dihydrate ($CaCl_2 \cdot 2H_2O$) (99+%, ACS reagent, Aldrich), and 0.037 g potassium hydrogen phosphate ($K_2HPO_4$) (99.99%, Aldrich)) in sequence. The solution changed from clear to opaque after $K_2HPO_4$ was introduced. The pH of the solution was approximately 9.78 measured with a pH meter. An adequate amount of HCl (38%, Mallinckrodt Chemicals) was used to titrate the solution to a pH of 7.20. The solution returned to clear after the titration process.

B. Electrochemical Deposition of HAP

The beaker containing the electrolyte was transferred to a preheated oil bath. After approximately 1 hour, the electrolyte temperature was stabilized at 95° C. A constant electric current was applied using a DC power supply. The current density was set to 25.0 mA/cm² (based on the area of the Pd cathode) for 4 min. A magnetically coupled stir bar turning at 600 rpm was utilized to stir the bath throughout the deposition process. After the electrochemical deposition of hydroxyapatite, the cathode electrode was taken out of the electrolyte, rinsed with deionized water several times and dried in air. The resulting HAP film on the cathode was used as the seed layer for the post-growth (secondary and tertiary growth) of HAP in hydrothermal synthesis.

C. Secondary Growth

The synthetic solution was prepared by dissolving $Ca(NO_3)_2$, $Y(NO_3)_3$ and $Na_2EDTA$ in 15 ml deionized water, and $(NH_4)_2HPO_4$ was dissolved in the other 15 ml deionized water under a mild magnetic stirring. The two solutions were then mixed together after the pH was raised to 10 with approximately 28% ammonium hydroxide, respectively. The final aqueous solution contained 0.10 M $Ca(NO_3)_2$, 0.02 M $Y(NO_3)_3$, 0.13 M $Na_e$-EDTA and 0.06 M $(NH_4)_2HPO_4$. The solution was transferred into a 40 ml Teflon liner situated in a stainless steel autoclave. The HAP seeded electrode was fixed onto a Teflon plate and placed inside the synthetic gel with the seeded side facing down to the bottom of the Teflon liner. The autoclave was closed tightly and moved into a preheated gravity convection oven at 200° C. for 15 hours. After the reaction, the autoclave was cooled to room temperature in a fume hood. The sample was taken out, rinsed with deionized water several times, and dried in air.

D. Tertiary Growth

The synthetic solution was the same as that in secondary growth except that cetylpyridium chloride (0.01 M) was added in the reactant solution. All experimental procedures were the same as those used for secondary growth.

E. Scanning Electron Microscopy

Figure 16:
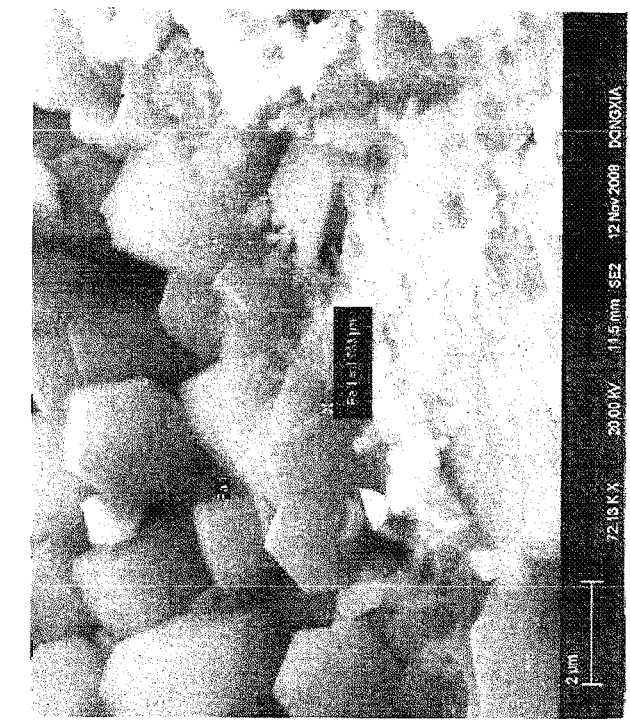
FIGS. 16a, b show a SEM top-view image and a side-view image, respectively, of a Yttrium-substituted HAP film produced by seeded hydrothermal growth according to an embodiment of the invention.
Figure 16:

Images of crystalline HAP films were taken with a scanning electron microscope at an accelerating voltage of 10 kV. FIGS. 16a, b show a top-view image and a side-view image, respectively, of Y-HAP films produced by seeded hydrothermal growth according to an embodiment of the invention.

Yttrium nitrate can be added along with calcium nitrate during hydrothermal synthesis to obtain crystalline films with varying levels of yttrium substitution.

III. Synthesis and SEM Characterization of Fluorine Substituted Hydroxyapatite (F-HAP)

A. Preparation of Electrolyte

This was the same as for the synthesis of yttrium substituted hydroxyapatite, above.

B. Electrochemical Deposition of HAP

This was the same as for the synthesis of yttrium substituted hydroxyapatite, above.

C. Secondary Growth

A synthetic solution was prepared by dissolving $Ca(NO_3)_2$ and $Na_2EDTA$ in 15 ml deionized water; and $NH_4F$ and $(NH_4)_2HPO_4$ in the other 15 ml deionized water under a mild magnetic stirring. The two solutions were then mixed together after pH was raised to 10 with approximately 28% ammonium hydroxide, respectively. The final aqueous solution contained 0.10 M $Ca(NO_3)_2$, 0.10 M $Na_2$-EDTA, 0.01 M $NH_4F$ and 0.01 M $(NH_4)_2HPO_4$. The solution was transferred into a 40 ml Teflon liner, situated in a stainless steel autoclave. The HAP seeded electrode was fixed onto a Teflon plate and placed inside the synthetic gel with the seeded side facing down to the bottom of the Teflon liner. The autoclave was closed tightly and moved into a preheated gravity convection oven at 200° C. for 15 hours. After the reaction, the autoclave was cooled to room temperature in a fume hood. The sample was taken out, rinsed with deionized water several times, and dried in air.

D. Tertiary Growth

The synthetic solution was the same as that in secondary growth except that cetylpyridium chloride (0.01 M) was added in the reactant solution. All experimental procedures were the same as those used for secondary growth.

E. Scanning Electron Microscopy

Figure 17:
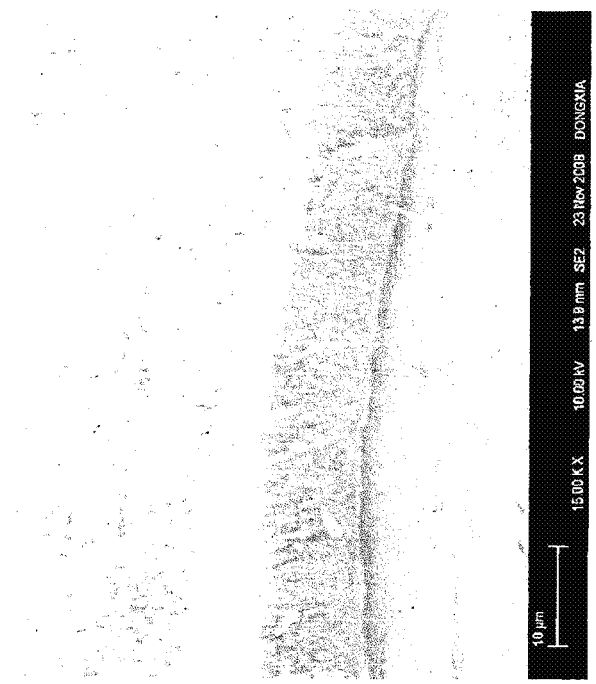
FIGS. 17a, b show a SEM top-view image and a side-view image, respectively, of a Fluorine-substituted HAP film produced by seeded hydrothermal growth according to an embodiment of the invention.
Figure 17:

Images of crystalline HAP films were taken with a scanning electron microscope at an accelerating voltage of 10 kV. FIGS. 17a, b show a top-view image and a side-view image, respectively, of F-HAP films produced by seeded hydrothermal growth according to an embodiment of the invention.

IV. Comparative Fuel Cell Performance

Figure 18:
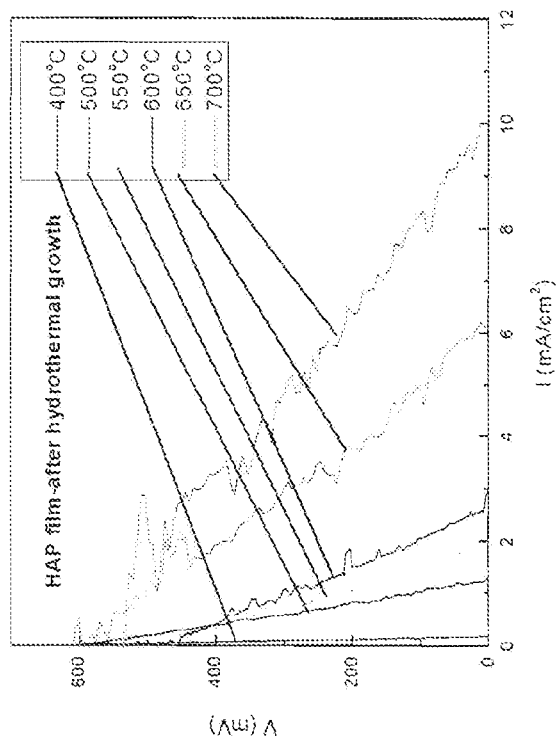
FIG. 18 graphically shows comparative fuel cell performance under different temperatures measured on HAP films by seeded hydrothermal growth, according to an illustrative aspect of the invention.

FIG. 18 graphically shows comparative fuel cell performance under different temperatures measured on HAP films by seeded hydrothermal growth, according to an illustrative aspect of the invention.

Figure 19:
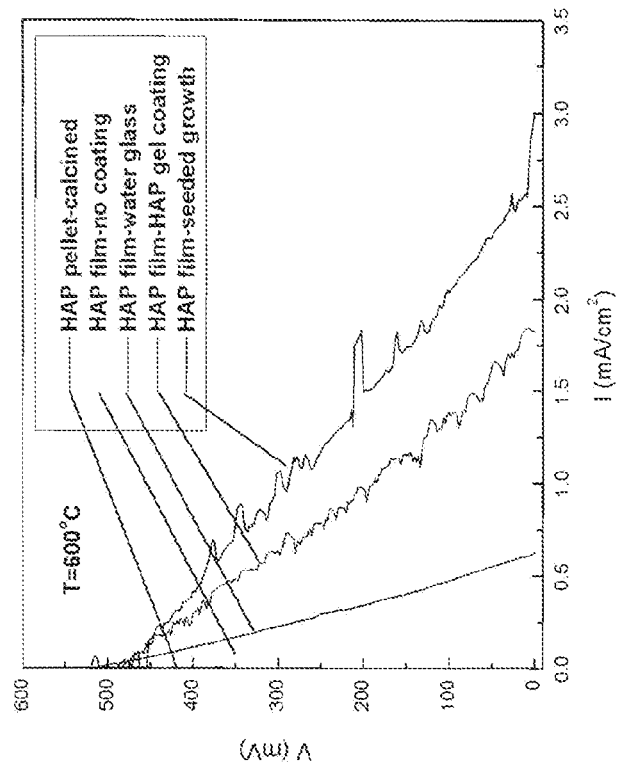
FIG. 19 graphically shows comparative fuel cell performance at 600° C. measured on HAP pellet and films prepared by different approaches (limiting current density from low to high: HAP sintered pellet (at 1000° C. for 10 hours); HAP films produced by electrochemical deposition; HAP films produced by electrochemical deposition with water glass coated gaps between crystals; HAP films produced by electrochemical deposition with HAP gel-coated gaps between crystals; HAP films by seeded hydrothermal growth.

FIG. 19 graphically shows comparative fuel cell performance at 600° C. measured on HAP pellet and films prepared by different approaches (limiting current density from low to high: HAP sintered pellet (at 1000° C. for 10 hours); HAP films produced by electrochemical deposition; HAP films produced by electrochemical deposition with water glass coated gaps between crystals; HAP films produced by electrochemical deposition with HAP gel-coated gaps between crystals; HAP films by seeded hydrothermal growth.

In summary, c-axis oriented HAP thin films synthesized by seeded growth on a palladium hydrogen membrane substrate have been disclosed. An exemplary synthetic process included electrochemical seeding on the substrate, and secondary and tertiary hydrothermal treatments under conditions that favor growth along c-axis and a-axis in sequence. By adjusting corresponding synthetic conditions, an HAP this film can be grown to a controllable thickness with a dense coverage on the underlying substrate. Proton conductivity measurement showed that the thin films have relatively high conductivity under hydrogen atmosphere and high temperature conditions. The c-axis oriented films obtained by the embodied technique may be integrated into fuel cells for application in the intermediate temperature range of 200-600° C. The electrochemical-hydrothermal deposition technique disclosed herein may be applied to create other oriented crystal materials having optimized properties, useful for separations and catalysis as well as electronic and electrochemical applications, electrochemical membrane reactors, and in chemical sensors.

V. Additional Embodiments Generally

Additional embodiments provide methods for forming high-density and gas-tight HAP films (i.e., at least yttrium doped Y-HAP films and carbonated $CO_3$-HAP films) located and formed upon substrates including but not limited to palladium substrates and titanium substrates. The high-density and gas-tight HAP films deposited in accordance with the additional embodiments are deposited using: (1) an electrochemical deposition method for forming a HAP seed layer upon a substrate; followed by (2) a hydrothermal deposition method using a single hydrothermal deposition solution composition for forming the high-density and gas-tight HAP film upon the substrate including the seed layer. Thus, the additional embodiments yield a two-step method for forming a high-density and gas-tight HAP film, in comparison with the three-step method described above. The high-density and gas-tight HAP film is c-axis aligned with respect to the substrate as evidenced and characterized by an x-ray diffraction spectrum that includes substantially only a (002) peak in a 2Θ range from +/−20 to 40 degrees, which is indicative of c-axis alignment. Such high-density and gas-tight HAP films are desirable, for example and without limitation, within proton exchange membrane fuel cells.

In addition to the foregoing additional methods, the additional embodiments also include particular HAP based film compositions and related fuel cell constructions. HAP films that possess the foregoing high-density and gas-tight properties in accordance with the additional embodiments may be fabricated using hydrothermal processing that particularly controls, at minimum, concentrations of a calcium source material and a phosphorus source material within a single hydrothermal deposition solution composition to yield the foregoing high-density gas-tight HAP films. Additionally controlled may be a chelating agent, such as but not limited to an ethylene-diamine-tetraacetic-acid (EDTA) based chelating agent. Additionally controlled may be a dopant, such as but not limited to a metal ion dopant or a carbonate dopant.

While the following additional embodiments illustrate the invention largely within the context of a Y-HAP film and a $CO_3$-HAP film having high-density and gas-tight properties in accordance with the embodiments, the additional embodiments are not necessarily intended to be so limited. Rather, the additional embodiments contemplate applicability within the context of methods for forming HAP films including but not limited to undoped HAP films and doped HAP films generally, but more particularly including but not limited to yttrium doped Y-HAP films and carbonate doped $CO_3$-HAP films.

The description that follows will first describe general conditions for forming a high-density gas-tight HAP film upon a substrate while using a sequential electrochemical deposition and hydrothermal deposition method in accordance with the additional embodiments. The description that follows will next describe specific conditions for forming a high-density gas-tight Y-HAP film upon a palladium substrate while using a sequential electrochemical deposition and hydrothermal deposition method in accordance with the additional embodiments. The description that follows will next describe specific conditions for forming a high-density gas-tight Y-HAP film upon a titanium substrate while using a sequential electrochemical deposition and hydrothermal deposition method in accordance with the embodiments. The description that follows will finally describe specific conditions for forming a high-density gas-tight $CO_3$-HAP film upon a titanium substrate using a sequential electrochemical deposition and hydrothermal deposition method in accordance with the embodiments.

VI. General Conditions for Forming a High-Density Gas-Tight HAP Film Upon a Substrate in Accordance with the Additional Embodiments For reference purposes, FIG. 2(a) again shows crystallographic axis designations for a HAP crystal, where a c-axis represents a long axis, and an a-axis and a b-axis typically represent shorter axes that define and comprise a plane perpendicular to the c-axis. FIG. 2(b) shows a molecular structure of a HAP crystal with particular atoms oriented with respect to the designated c-axis. Finally, FIG. 2(c) is intended to illustrate proton transport through the HAP film when the HAP film has a c-axis alignment and orientation perpendicular with respect to a substrate that is designated as a horizontal line.

FIG. 3(a) schematically shows HAP crystals that are randomly oriented with c-axes that are not aligned with respect to each other or with respect to a substrate. In contrast, FIG. 3(b) schematically shows an ideal HAP film or membrane structure with the c-axes of HAP crystals spanning an entire HAP film or membrane thickness to optimize proton transport while providing a high-density and gas-tight HAP film.

FIG. 4(a) shows a substrate as a rectangular base support component having a HAP seed layer located and formed thereupon as illustrated as individual HAP islands located and formed upon the substrate. FIG. 4(b) shows an intermediate process step where HAP crystals in a c-axis alignment are deposited and grown upon the HAP islands in accordance with the embodiments. FIG. 4(c) shows a high-density gas-tight HAP film located and formed upon the substrate with c-axis alignment and a-axis and b-axis continuity. As is illustrated in FIG. 4(c), the HAP film located and formed upon the substrate provides that the c-axis crystal domain substantially spans a HAP film thickness perpendicular to the substrate upon which is located and formed the HAP film.

The additional embodiments provide a sequential electrochemical HAP seed layer deposition method and hydrothermal HAP film deposition method for forming the high-density gas-tight HAP film located and formed upon the substrate in accordance with the progressive illustrations of FIG. 4(a) to FIG. 4(c) while using a single hydrothermal deposition solution composition (i.e., in contrast with multiple hydrothermal deposition solutions of more than one single composition). As noted above, the additional embodiments realize the foregoing objects by controlling at least a calcium source material concentration with respect to a phosphorus source material concentration when depositing the high-density and gas-tight HAP film in accordance with the additional embodiments while using the hydrothermal deposition method in accordance with the additional embodiments.

High-density and gas-tight HAP films in accordance with the additional embodiments may be located and formed upon or over substrates including but not limited to electrically conductive substrates such as but not limited to palladium substrates and titanium substrates. High-density and gas-tight HAP films in accordance with the additional embodiments may also be located and formed upon or over substrates including but not limited to semiconductor substrates and dielectric substrates, such as but not limited to certain ceramic substrates. High-density and gas-tight HAP films in accordance with the additional embodiments may also be fabricated ultimately as free standing films or membranes when separated from a substrate upon or over which they are formed.

Within the context of the additional embodiments, when a high-density and gas-tight HAP film comprises an undoped HAP film, the high-density and gas-tight HAP film may be formed using a calcium source material to phosphorus source material molar concentration ratio from about 1.5:1 to about 4:1. When a chelating agent such as but not limited to EDTA or an EDTA salt is included within a single hydrothermal deposition solution composition, a calcium source material to phosphorus source material to chelating agent molar concentration ratio may be from about 1.5:1:1.5 to about 4:1:4.

Within the context of the additional embodiments, when a high-density and gas-tight HAP film comprises a doped HAP film, and in particular a Y-HAP film, the high-density gas-tight Y-HAP film may be formed using a calcium source material to phosphorus source material to yttrium source material (or other metal ion dopant) molar concentration ratio from about 1.5:1:0.1 to about 1.5:1:0.2. When a chelating agent such as but not limited to EDTA or an EDTA salt is included within a single hydrothermal deposition solution composition, a calcium source material to phosphorus source material to yttrium source material (or other metal ion dopant) to chelating agent molar concentration ratio may be from about 1.5:1:0.1:1.65 to about 1.5:1:0.2:1.8.

Within the context of the additional embodiments, when a high-density and gas-tight HAP film comprises a doped HAP film, and in particular a $CO_3$-HAP film, the high-density gas-tight $CO_3$-HAP film may be formed using a calcium source material to phosphorus source material to urea source material molar concentration ratio from about 1.5:1:2 to about 1.5:1:3. When a chelating agent such as but not limited to EDTA or an EDTA salt is included within a single hydrothermal deposition solution composition, a calcium source material to phosphorus source material to urea source material to chelating agent molar concentration ratio may be from about 1.5:1:2:1.5 to about 1.5:1:3:1.5. When a metal ion dopant is further included within a single hydrothermal deposition solution composition, a calcium source material to phosphorus source material to urea source material to chelating agent to metal ion dopant molar concentration ratio may be from about 1.5:1:2:1.5:0.1 to about 1.5:1:2:1.5:0.5.

Finally, although the additional embodiments that follow illustrate an electrochemical deposition method for forming a HAP seed layer upon or over a substrate followed by a hydrothermal deposition method for forming a high-density and gas-tight HAP layer upon or over a substrate including the HAP seed layer, the additional embodiments are not necessarily intended to be so limited. Rather, a seed layer in accordance with the embodiments may be deposited using any of several methods, including but not limited to physical deposition methods and chemical deposition methods, and subsequently have formed thereupon a high-density and gas-tight HAP layer while using a hydrothermal method in accordance with the additional embodiments.

VII. High-Density and Gas-Tight Y-HAP Film on Palladium Substrate in Accordance with the Additional Embodiments A. Film Deposition Materials and Methodology A HAP seed layer was deposited upon a pre-cleaned Pd plate (12.5×12.5×0.1 mm). The Pd plate was used as a cathode in conjunction with an anode that comprised a platinum plate (25×25×0.127 mm). An electrochemical deposition solution consisted of 138 mM NaCl, 50 mM tris(hydroxymethyl)-aminomethane, 1.3 mM $CaCl_2$ and 0.84 mM $K_2HPO_4$ in deionized water. The solution was buffered to pH 7.2 using 37% hydrochloride acid. The electrochemical HAP seed layer deposition reaction was carried out at ~95° C. for 5 min with constant current density of 9.3 mA/cm². After the HAP seed layer deposition reaction, the Pd plate seeded with the HAP seed layer crystals was taken out of the electrochemical deposition solution, rinsed with deionized water several times, and dried in air.

The HAP seed layer seeded Pd substrate was placed in a Teflon-lined pressure vessel (Parr Instruments model 4744) with the HAP seed layer facing down and tilted up at about 45° relative to the bottom of the vessel. For a typical high-density and gas-tight HAP layer hydrothermal deposition process, $Na_2EDTA$ was first completely dissolved into 30 ml deionized water. $Ca(NO_3)_2$, $Y(NO_3)_3$ and $(NH_4)_2HPO_4$ was successively added and the hydrothermal deposition solution was allowed to stir for 30 min. The concentrations used for hydrothermal deposition were 0.3 M $Ca(NO_3)_2$, 0.015 M $Y(NO_3)_3$, 0.3225 M $Na_2EDTA$, and 0.09 M $(NH_4)_2HPO_4$. The solution was adjusted to pH 10.0 with ammonium hydroxide and then transferred to the Teflon-lined vessel to immerse the seeded substrate. The Teflon-lined vessel was placed into a convective oven for hydrothermal deposition at 200° C. Hydrothermal deposition was repeated four times and each crystallization step was carried out for 15 h at 200° C. Between each hydrothermal deposition step, the vessel was allowed to cool to room temperature, the sample taken out and rinsed with deionized water, and placed back into the vessel with fresh hydrothermal deposition solution of the above single composition. After the final reaction, the vessel was cooled to room temperature in air, the sample was taken out, rinsed with deionized water several times, and dried in air.

B. Physical and Chemical Analysis of Y-HAP Film on Palladium Substrate

Physical morphology and elemental analysis of the high-density and gas-tight Y-HAP film located and formed upon the palladium substrate were examined using a field emission source scanning electron microscope (FESEM, Zeiss-Leo DSM982) equipped with an energy dispersive x-ray spectrometer (EDX Phoenix). The crystal structure of the high-density and gas-tight film was determined by X-ray diffraction (XRD) (Philips PW3020) with Cu Kα radiation ($\lambda=1.5418$ Å) in the 2θ range from 20° to 40°. The crystallographic texture of the HAP seed layer and the high density and gas-tight Y-HAP film was evaluated by pole figures of the (002) plane using a Philips Hi-Resolution X'PERT PRO X-Ray diffractometer (PANalytical, Netherlands). The (002) peak intensity was measured at every 5 degrees of tilt angle, starting from zero degree (normal to the substrate) to 85 degrees. At each tilt angle, the data was collected as the sample was rotated 360 degrees. In each plot the intensity was normalized to the most intense peak. The intensity plots represent the distribution of (002) planes relative to the substrate surface.

C. Results and Discussion

To further enhance proton conductivity in comparison with undoped high-density and gas-tight HAP films, the embodiments investigated microstructural engineering of high-density and gas-tight yttrium-doped hydroxyapatite (Y-HAP) films, with the chemical formula $Ca_{10-x}Y_x(PO_4)_6(OH)_{2-x}O_x$. Yttrium ions ($Y^{3+}$) substitute for calcium ions ($Ca^{2+}$) in the undoped HAP crystal framework. Doping with yttrium presumably affects the number of hydroxyl groups in the material, as $OH^-$ is converted to $O^{2-}$ for electrical charge compensation. As yttrium doping level increases, the proton conductivity is increased and the activation energy for proton transport is reduced. The proton conductivity of bulk Y-HAP has been shown to reach a maximum value of $\sim 10^{-4}$ S/cm at 800° C. with the concentration parameter x=0.65 (a Ca/Y ratio of 14.4). For x>0.65, the overall conductivity falls sharply, and oxygen ion conduction through the material begins to occur. As the concentration parameter x is increased from 0.65 to 1.0, the Y-HAP material transitions from a pure proton conductor to a pure oxygen ion conductor, and the overall conductivity falls from $\sim 10^{-4}$ to $\sim 10^{-7}$ S/cm at 800° C. Therefore, a Ca/Y ratio of 14.4 is optimal to obtain pure proton conducting material of maximum conductivity.

A HAP seeded surface crystallization technique was developed for Y-HAP film deposition similar to that which may be used for a HAP film. The first step was to electrochemically deposit a HAP seed crystal layer onto a palladium foil (100 μm thick). Palladium was chosen because of its proton conducting properties and ability to act as an electrode during electrochemical characterization of the membrane. The palladium surface was first roughened with 800 grit SiC sand paper and then cleaned thoroughly. The palladium foil was submerged in a HAP seed deposition solution similar to that used for electrochemical deposition of HAP onto titanium orthopedic implants, and positioned parallel to a platinum foil held ~1 cm away. The platinum and palladium were connected to a DC power supply as anode and cathode, respectively. Growth of the HAP seed layer onto the palladium foil cathode was achieved by passing a DC current density of 9.5 mA/cm² for 4 minutes at 95° C. The HAP seed layer deposition time and current density were kept low to avoid embrittlement of the palladium due to exposure to hydrogen from water electrolysis during the deposition.

Figure 20:
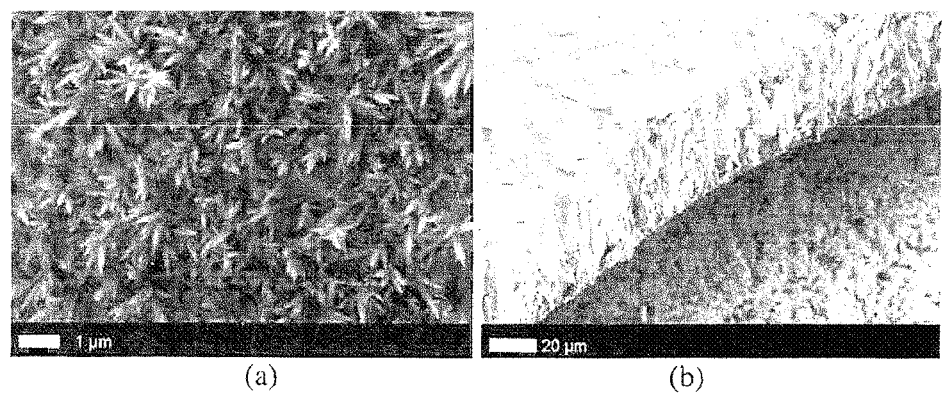
FIG. 20 shows: (a) a top-view scanning electron microscopy image of a HAP seed layer; and (b) a side-view scanning electron microscopy image of a high-density gas-tight Y-HAP film, located and formed upon a palladium substrate in accordance with the embodiments.

FIG. 20(a) shows an SEM image showing the top view of the resulting HAP seed layer crystals on palladium. The rod-shaped crystals are ~150 nm in width and ~1 μm in length. The HAP seed layer crystal morphology on the palladium substrate is similar to that obtained by electrochemical deposition of HAP on titanium and stainless steel for orthopedic implant applications.

To form a high-density gas-tight Y-HAP film or membrane onto the HAP seed layer seeded palladium substrate surface, a hydrothermal deposition and crystal growth method mediated by ethylenediaminetetraacetic acid disodium salt (EDTA) was used. The hydrothermal deposition solution comprised calcium nitrate, yttrium nitrate, ammonium phosphate, EDTA, and ammonium hydroxide to adjust a starting pH to 10. The EDTA was added to chelate calcium and yttrium ions in solution to control supersaturation of Y-HAP in order to promote surface crystal growth by limiting homogeneous crystal nucleation from solution. The palladium substrate was submerged in the hydrothermal deposition solution with the HAP seed layer seeded side facing downward at ~45 degree angle relative to the bottom of the reaction vessel to avoid accumulation of homogeneously nucleated Y-HAP crystals on the HAP seed layer seeded substrate by sedimentation. Hydrothermal high-density and gas-tight Y-HAP film deposition and crystal growth was carried out in a Teflon-lined pressure vessel for 15 hours at 200° C. The sample was then cooled to room temperature, removed, and rinsed in deionized water. The reaction vessel was filled with fresh solution, the rinsed substrate placed back in the vessel, and hydrothermal deposition was repeated. Hydrothermal deposition was repeated a total of four times (60 total hours of deposition and crystallization at 200° C. while using a single hydrothermal deposition solution composition) to obtain a high-density gas-tight Y-HAP film membrane located and formed upon the palladium substrate. FIG. 20(b) shows a side-view scanning electron microscopy image of a broken section of the Y-HAP film located and formed upon the palladium substrate surface. The Y-HAP film has a dense and continuous morphology of approximately 30 μm thickness. On the upper surface, some hexagonal facets of individual Y-HAP crystal domains are visible. The Y-HAP crystal domains are intergrown to form a continuous membrane over the entire surface of the palladium substrate.

The elemental composition of the HAP seeds within the HAP seed layer, and the Y-HAP film membrane was probed with an energy dispersive x-ray spectrometer (Phoenix EDX) attached to the electron microscope. For the HAP seed layer, the Ca/P ratio was measured to be 1.65, compared to the Ca/P ratio in the single hydrothermal deposition solution composition of 1.67. Calcium deficiency in the deposited seed layer crystals is consistent with observation of other reports of hydrothermal synthesis of hydroxyapatite. The Ca/Y ratio in the Y-HAP film membrane was measured to be 14.5, very close to a value of 14.4 previously reported to give rise to maximum proton conductivity in bulk Y-HAP. The synthesis solution had a Ca/Y ratio of 20. The lower Ca/Y ratio measured for the Y-HAP film suggests that yttrium is more reactive than calcium ions, so that there is not a direct correlation between the composition of the starting hydrothermal deposition solution and the final Y-HAP film product.

Figure 21:
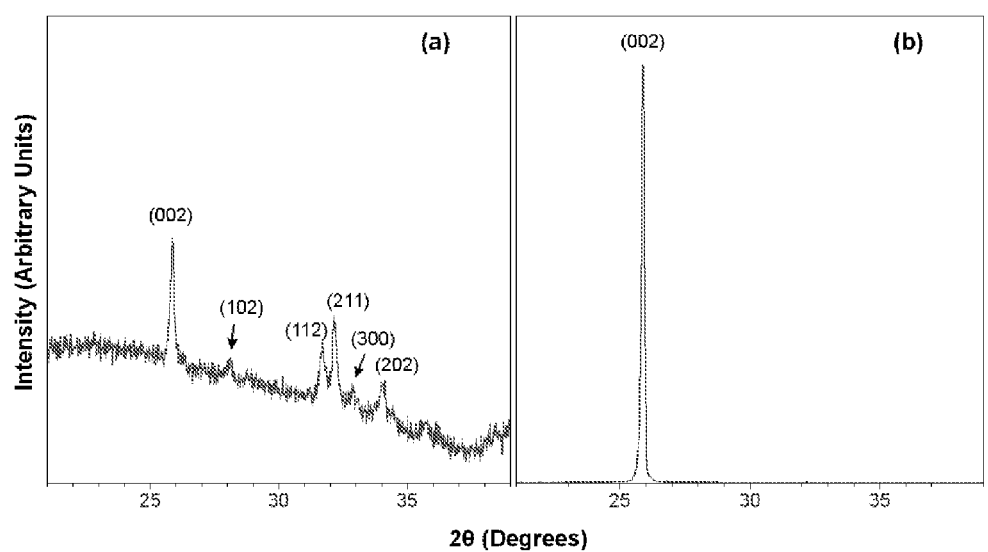
FIG. 21 shows powder x-ray diffraction spectra of: (a) of a HAP seed layer; and (b) a high-density gas-tight Y-HAP film, located and formed upon a palladium substrate in accordance with the embodiments.

The crystal structure and orientation of the HAP seed layer and the Y-HAP film were probed with powder x-ray diffraction, as shown on FIG. 21. The diffraction pattern of the HAP seed layer as illustrated in FIG. 21(a) is consistent with HAP, with no evidence of secondary crystal phases. The diffraction pattern for the HAP seed layer showed a shoulder of a very broad peak near 23 degrees that indicates some amorphous material was present. For the hydrothermally deposited Y-HAP film membrane, there is no evidence of amorphous material remaining. The most prominent feature of the hydrothermally deposited Y-HAP film membrane diffraction pattern is a remarkable enhancement of the (002) peak. Enhancement of the (002) peak is consistent with preferred orientation of the Y-HAP crystal c-axis normal to the palladium substrate. The degree of preferred orientation can be probed by calculating the texture coefficient of the (002) peak, $T_{c(002)}$, defined as:

$$T_{c(002)} = \frac{I_{(002)}/I_{r(002)}}{\frac{1}{n}[\sum I_{(hkl)}/I_{r(hkl)}]}$$

where $I_{hkl}$ are the peak intensities measured from films, $I_{r(hkl)}$ are the intensities of randomly oriented HAP powders from the XRD reference peaks (JCPDS card 09-0432), and n is the number of diffraction peaks considered. Therefore, a randomly oriented powder would have $T_{c(002)}=1$, and preferential orientation of the c-axis normal to the substrate would result in $T_{c(002)}>1$. The value of $T_{c(002)}$ was calculated from the x-ray diffraction data relative to five other diffraction peaks corresponding to (102), (211), (112), (300) and (202) planes. Since a total of 6 peaks was considered (n=6), the maximum possible value of $T_{c(002)}=6$ would indicate perfect alignment of the c-axes normal to the substrate. For the HAP seed layer, $T_{c(002)}=1.9$, which indicates some preferred crystal orientation in the seed layer. The additional crystallization during hydrothermal deposition and growth greatly enhanced the preferred crystal orientation. For the Y-HAP film membrane on the palladium substrate, $T_{c(002)}=5.9$, which is close to the maximum $T_c$ value, indicating near perfect alignment in the films. The texture coefficient analysis is consistent with the SEM observations in FIG. 20 that show the rod shaped HAP seed layer crystals preferentially oriented normal to the substrate, and show hexagonal facets on the top view image of the Y-HAP film membrane.

Figure 22:
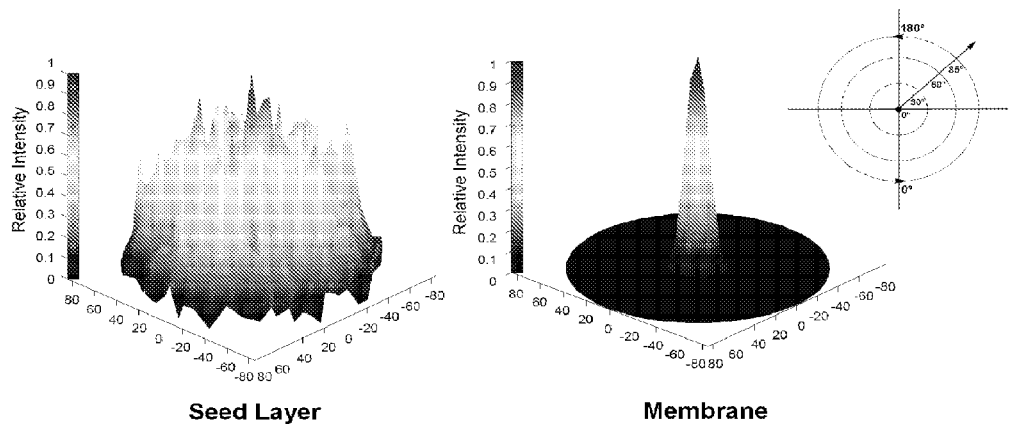
FIG. 22 shows pole figures illustrating relative intensity of x-ray diffraction spectra from the (002) planes of: (a) a HAP seed layer; and (b) a high-density gas-tight Y-HAP film, located and formed upon a palladium substrate in accordance with the embodiments.

FIG. 22 shows three dimensional XRD pole scans of the (002) peak of the HAP seed layer and Y-HAP film membrane. The (002) peak intensity was measured at every 5 degrees of tilt angle, starting from zero degrees (normal to the substrate) to 85 degrees. At each tilt angle, the data was collected as the sample was rotated 360 degrees. The x-y plane in FIG. 22 is in Cartesian coordinates obtained by converting the polar coordinates of tilt angle and rotation angle in degrees. For perfectly aligned crystal domains with c-axis normal to the substrate, the pole figure contour would appear as a point with maximum intensity at zero degrees and falling to zero as the sample is tilted. The HAP seed layer has significant reflections from (002) plans at all tilt angles measured. This indicates that some fraction of the seed crystals are oriented with the c-axis normal to all tilt angles measured. For the Y-HAP film membrane, however, the intensity of the (002) peak falls markedly as the sample is tilted. There is little measurable intensity from the (002) peak at a tilt angle of ~15 degrees or higher. The results show that nearly all of the crystal domains in the high-density gas-tight Y-HAP film are oriented within 15 degrees of normal to the palladium substrate. It is interesting to note that the misaligned HAP seed layer crystals do not significantly contribute to the x-ray diffraction from the high-density and gas-tight Y-HAP film membranes, indicating the volume fraction of misaligned HAP seed layer crystals is very low in the final high-density and gas-tight Y-HAP film membrane. It is possible that some of the HAP seed layer crystals were consumed through dissolution/reprecipitation process during the long hydrothermal reaction when forming the high-density gas-tight Y-HAP film.

Figure 23:
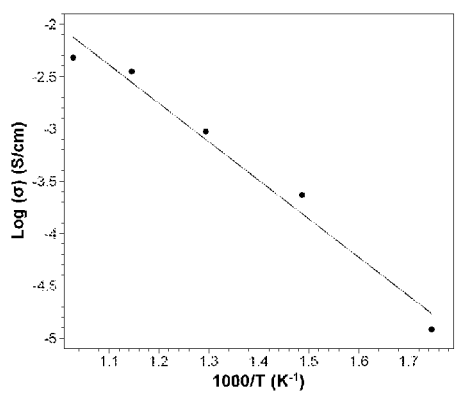
FIG. 23 shows a graph of proton conductivity versus reciprocal temperature for a high-density gas-tight Y-HAP film located and formed upon a palladium substrate in accordance with the embodiments.

The proton conductivity of the high-density gas-tight Y-HAP film membrane was measured at temperatures from 300-700° C., as shown in FIG. 23. The conductivity was measured from electrical impedance spectroscopy using the two point probe method. The palladium foil substrate served as one electrode, and the counter electrode was platinum deposited on an upper surface of the high-density and gas-tight Y-HAP film membrane. The measurement was carried out with the Y-HAP film membrane in dry air. The palladium foil was sealed at the end of a ceramic tube to which hydrogen was fed. The results show significant proton conductivity, approaching $10^{-2}$ S/cm at 700° C. The proton conductivity compares favorably with many proton conducting ceramics used in fuel cells and other electrochemical devices. The linear curve fit to the data was used to calculate an activation energy for proton conduction of 0.73 eV. The activation energy is significantly lower than the value of 1.0 eV measured for proton conductivity of bulk Y-HAP having near the same composition as a high-density and gas-tight Y-HAP film membrane in accordance with the embodiments.

VIII. High-Density and Gas-Tight Y-HAP Film on Titanium Substrate in Accordance with the Additional Embodiments A. Film Deposition Materials and Methodology NaCl (≥99.0% purity), tris(hydroxymethyl)-aminomethane (99.8+% purity), $Ca(NO_3)_2.4H_2O$ (99.0% purity), and disodium ethylenediaminetetraacetate dehydrate ($Na_2EDTA.2H_2O$) (99.0-101.0% purity) were all obtained from Sigma-Aldrich. $Y(NO_3)_3.6H_2O$ (99.9% purity) and $(NH_4)_2HPO_4$ (>99.0% purity) were purchased from Alfa Aesar and EMD, respectively. $K_2HPO_4$ (99.99% purity), $CaCl_2.2H_2O$ (99+% purity). 37% hydrochloride acid and 28.0-30.0% ammonium hydroxide were purchased from Mallinckrodt Chemicals. Titanium (Ti) (0.89 mm thick), platinum (Pt) (0.127 mm thick) and palladium (Pd) (0.1 mm thick) foils were obtained from Alfa Aesar.

HAP seed layer seeds were deposited onto the titanium substrate using an electrochemical deposition method. In brief, a pre-cleaned titanium plate (12.5×12.5×0.89 mm) was used as a cathode and an anode was a platinum plate (25×25×0.127 mm). The electrochemical deposition solution consisted of 138 mM NaCl, 50 mM tris(hydroxymethyl)-aminomethane, 1.3 mM $CaCl_2$, 0.84 mM $K_2HPO_4$ in deionized water. The electrochemical deposition solution was buffered to pH 7.2 using 37% hydrochloric acid. The electrochemical HAP seed layer deposition reaction was carried out at ~95° C. for 5 min with constant current density of 12.5 mA/cm². After the HAP seed layer deposition, the titanium cathode electrode seeded with the HAP seed layer crystals was taken out of the electrolyte solution, rinsed with deionized water several times, and dried in air.

The HAP seed layer seeded titanium substrate was placed in a Teflon-lined vessel with the seed layer facing down and tilted up at about 45 degrees relative to the bottom of the vessel. For a typical hydrothermal deposition solution, $Na_2EDTA$ (0.115 M) was first completely dissolved into 30 ml deionized water. $Ca(NO_3)_2$ (0.1 M), $Y(NO_3)_3$ (0.01 M) and $(NH_4)_2HPO_4$ (0.06 M) were successively added and the solution was stirred for 30 min. The hydrothermal deposition solution was adjusted to pH 10.0 with ammonium hydroxide and then transferred to the Teflon-lined vessel to immerse the seeded substrate. The Teflon-lined vessel was sealed in a stainless steel autoclave and placed into a convective oven for hydrothermal deposition at 200° C. for 15 hours. After the high-density and gas-tight Y-HAP hydrothermal deposition reaction, the autoclave was cooled to room temperature in air. The high-density and gas-tight Y-HAP film coated titanium sample was taken out, rinsed with deionized water several times, and dried in air.

B. Physical and Chemical Analysis of Y-HAP Films on Titanium Substrate

Morphology of the product high-density and gas-tight Y-HAP film was examined using a field emission source scanning electron microscope (FESEM, Zeiss-Leo DSM982). The crystal structure of the high-density and gas-tight Y-HAP film was determined by X-ray diffraction (XRD) (Philips PW3020) with Cu Kα radiation ($\lambda=1.5418$ Å) in the 2θ range from 20° to 40°.

C. Results and Discussion

Figure 24:
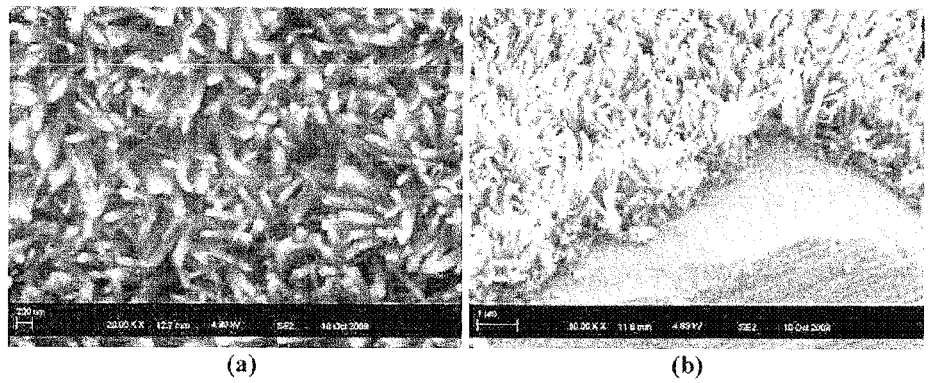
FIG. 24 shows: (a) top-view; and (b) side-view scanning electron microscopy images of a HAP seed layer located and formed upon a titanium substrate in accordance with the embodiments.

HAP seed layers were deposited onto the titanium substrate through electrochemical deposition conditions. In the electrochemical method, a direct current is applied through the electrochemical deposition solution containing dissolved calcium and phosphate. HAP seed layer seeds nucleate on the surface of the titanium metal cathode due to the accumulation of calcium ions by electrostatic attraction and the local increase in pH due to the electrolysis of water. Over a long electrochemical deposition time, hydrogen gas evolution on the titanium cathode surface tends to dislodge deposited HAP seed layer crystals, making HAP seed layers of uneven thickness. To overcome this limitation of electrochemical deposition, the reaction was carried out for only a short period of time to ensure a uniform coating. FIG. 24 shows the (a) top-view and (b) side-view of the HAP seed layer formed on the titanium substrate in 5 min at 95° C. with a constant current density of 12.5 mA/cm². The crystals in the HAP seed layer typically have needle-like morphology with lengths of 1-2 μm and a submicron width.

Figure 25:
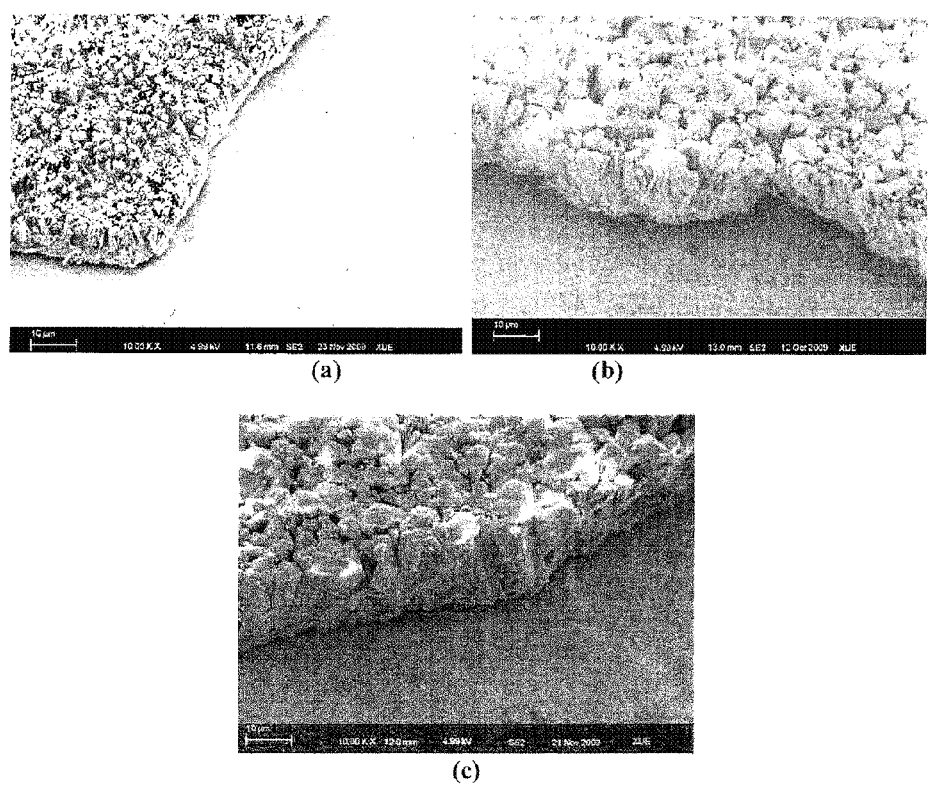
FIG. 25 shows side-view scanning electron microscopy images of high-density and gas-tight Y-HAP films located and formed upon a titanium substrate using hydrothermal process times of: (a) 5 hours (a); (b) 15 hours; and (c) 30 hours, in accordance with the embodiments.

The deposited HAP seed layer seeds provide nucleation sites for subsequent hydrothermal deposition and crystal growth of Y-HAP into a high-density and gas-tight Y-HAP crystalline film on the titanium substrate. EDTA was added to the hydrothermal deposition solution in order to chelate the calcium and yttrium ions. The hydrothermal deposition and growth was carried out at 200° C. and pH 10 with an aqueous solution of Ca-EDTA complex, Y-EDTA complex, ammonium phosphate and ammonium hydroxide to adjust solution pH. As the reaction mixture is heated, the EDTA complexes are broken down to release free calcium and yttrium cations. The free cations then react with ammonium phosphate to nucleate, deposit and grow Y-HAP. EDTA thus regulates supersaturation of Y-HAP in order to promote crystal growth onto the HAP seed layer seeded titanium surface and limit homogeneous nucleation in solution. FIG. 9 shows SEM images of hydrothermally deposited high-density and gas-tight Y-HAP layers obtained on the titanium substrate. FIG. 25(*a*) shows that the Y-HAP crystals grown for 5 hours have a size of ~1 μm in width and ~7 μm in length. As hydrothermal deposition reaction time was increased to 15 hours, the width of the particles increased to ~5 μm and the length was increased to ~11 μm, as shown in FIG. 25(*b*). Crystals grown for 30 hours are similar in size to those prepared for 15 hours, as shown in FIG. 25(*c*). Extending the growth time to 45 hours also produced crystals similar in size (not shown) to those produced after 15 hours. The hydrothermal deposition crystal growth onto the HAP seed layer seeded titanium substrate is initially rapid, but essentially stops beyond 15 hours. In the beginning of the reaction, a sufficient amount of reactants is available so that Y-HAP film crystals grow longer and wider with time. As the reaction proceeds, crystal growth slows as reactants are depleted due to growth on the HAP seed layer seeded titanium substrate, as well as homogeneous crystal nucleation from solution. Based on the results illustrated in FIG. 25(*a*) to FIG. 25(*c*), a hydrothermal deposition and growth time of 15 hours was chosen as a standard synthesis condition for y-HAP films.

Figure 26:
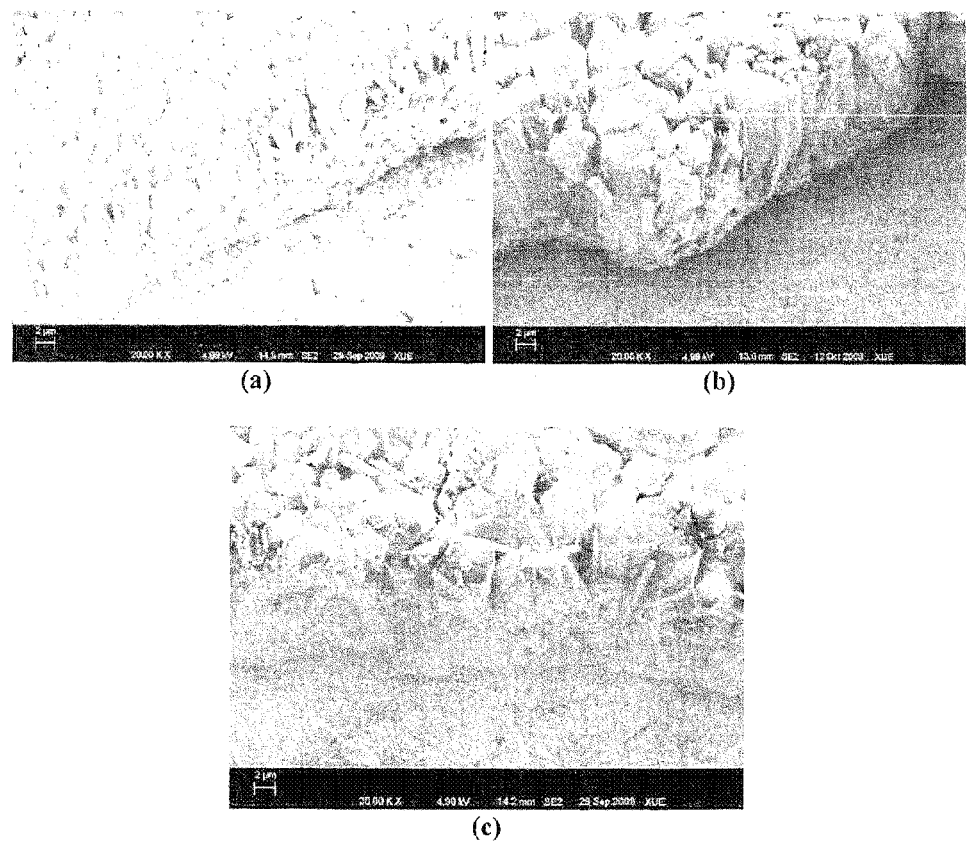
FIG. 26 shows side-view scanning electron microscopy images of high-density and gas-tight Y-HAP films located and formed upon a titanium substrate using a single hydrothermal deposition solution composition at: (a) pH 8; (b) pH 10; and (c) pH 11, in accordance with the embodiments.

FIG. 26 shows the effect of varying solution pH on the morphology of Y-HAP crystals grown on the HAP seed layer seeded titanium substrate for 15 hours at 200° C. It was found that the thickness and density of the Y-HAP coating both increased with increasing pH. FIG. 26(*a*) shows that the Y-HAP film crystals have a size of ~1-2 μm in width and ~10 μm in length when pH was 8. As pH was increased to 10 and 11, as is illustrated in FIG. 26(*b*) and FIG. 26(*c*), the width of the crystals increased to ~5-7 μm, while the coating thickness increased to ~11 μm. The release of free calcium and yttrium from EDTA complexes is regulated by pH as well as temperature. As pH is increased, the dissolution of the EDTA complexes is slowed, which leads to less free calcium and yttrium ions. The degree of solution supersaturation is therefore lowered with increasing pH so that homogeneous nucleation is reduced and the growth onto the HAP seed layer seeded titanium substrate surface is preferred. As a result, a more dense Y-HAP film located and formed on the titanium substrate is obtained as pH is increased.

Figure 27:
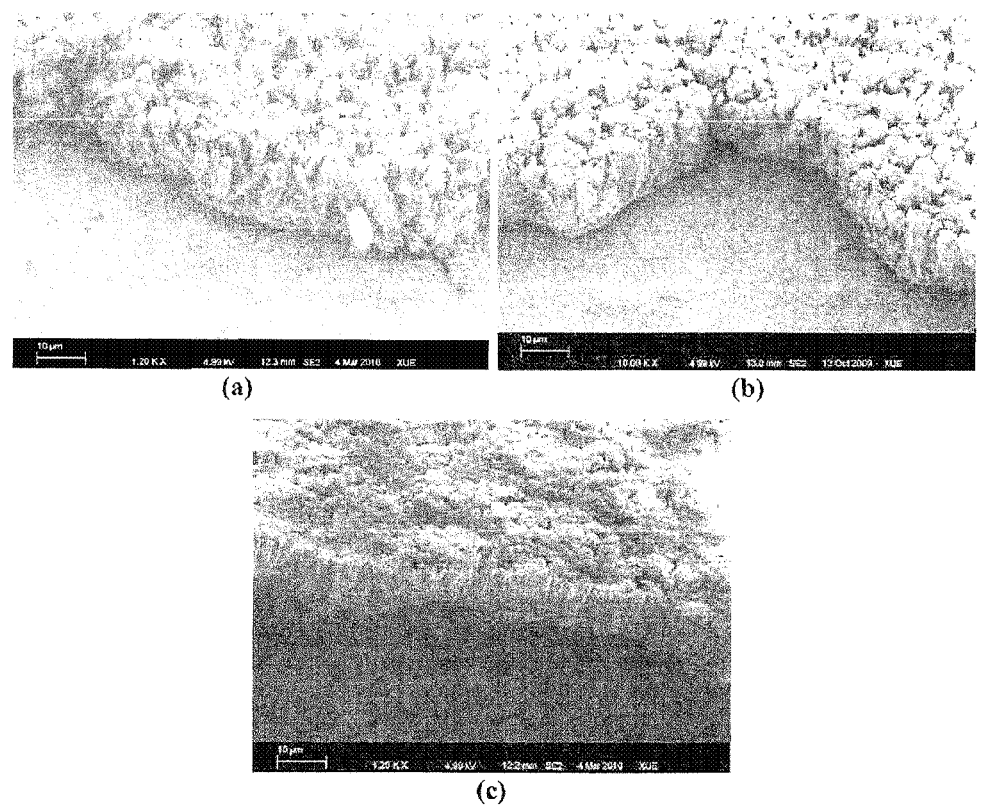
FIG. 27 shows side-view scanning electron microscopy images of high-density and gas-tight Y-HAP films located and formed upon a titanium substrate using a single hydrothermal deposition solution composition at a calcium source material concentration of: (a) 0.05 M; (b) 0.1 M; and (c) 0.2 M, in accordance with the embodiments.

The influence of calcium concentration on the high-density and gas-tight Y-HAP film crystal morphology produced at 200° C. for 15 hours at pH 10 is shown in FIG. 27. The starting calcium concentration was varied from: (a) 0.05 M; (b) 0.1 M; and (c) 0.2 M, while the yttrium concentration was fixed at 0.01 M and phosphate concentration was fixed at 0.06 M. To fully complex the calcium added, the amount of EDTA was adjusted according to the equation: [EDTA]=[Ca]+1.5[Y]. The cross-sectional SEM images reveal that the thickness of the high-density and gas-tight HAP films decreases slightly while the density increases significantly as calcium concentration is raised. When the starting calcium concentration is 0.05 M, the coating thickness is around 12 μm and many gaps between crystals are observed to extend down to the bottom of the coating. As the calcium concentration was increased to 0.2 M, most crystal domains grew together to form a high-density and gas-tight Y-HAP film with a thickness of 10 μm. The side view image in FIG. 27(*c*) shows the gaps between crystal domains on the upper surface do not extend throughout the Y-HAP film.

Studies of hydroxyapatite as a liquid chromatography packing suggest that the crystal facets parallel to the c-plane (or c-surfaces) are positively charged while those parallel to the (a, b) plane (or a-surfaces) are negatively charged. Since a small fraction of Y substitution does not affect the structure of HAP crystals due to the similar size of $Y^{3+}$ and $Ca^{2+}$, one may postulate that the surface charges of Y-HAP crystal structure faces are similar to that of HAP crystal structure faces. It is expected that the positively charged calcium ions are preferentially absorbed to the negative charged a-surfaces. When a nonreactive molecule or ion preferentially adsorbs onto one facet of a growing crystal, it lowers the interfacial free energy of that facet, and the crystal growth onto that facet is slowed relative to others. However, calcium also participates in the crystal growth reaction so that increasing calcium concentration can promote lateral intergrowth of crystals along a-axis to produce a dense coating as a result of an increase in local supersaturation.

Figure 28:
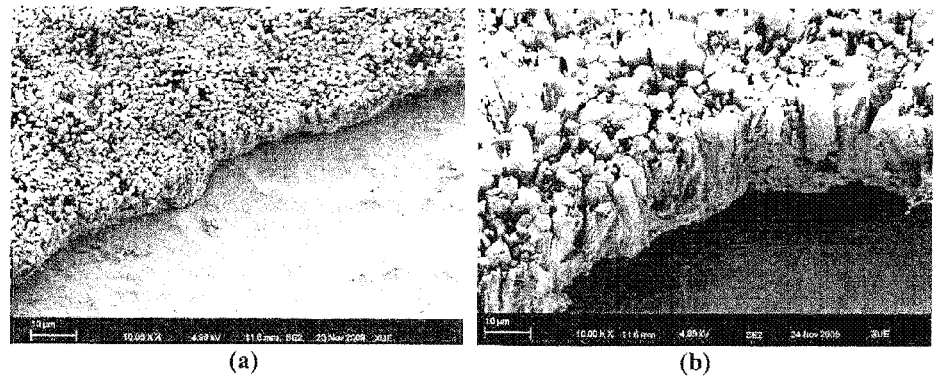
FIG. 28 shows side-view scanning electron microscopy images of high-density and gas-tight Y-HAP films located and formed upon a titanium substrate using a single hydrothermal deposition solution composition at a phosphorus source material concentration of: (a) 0.03 M; and (b) 0.09 M, in accordance with the embodiments.

The effect of phosphate concentration on the Y-HAP films deposited with the hydrothermal method in accordance with the embodiments was investigated by varying the initial phosphate concentration from 0.03 M and 0.09 M, while the concentration of calcium was held constant at 0.1 M and yttrium held constant at 0.01 M. As shown in FIG. 28, increasing phosphate concentration results in thicker films consisting of larger crystals. With 0.03 M phosphate, the crystal width and length in the coatings were around 1 μm and 5 μm, respectively, as illustrated in FIG. 28(a). Increasing in the phosphate concentration to 0.09 M produced crystals ~6 μm in width, while the length was increased to ~15 μm, as illustrated in FIG. 28(b). It is expected that the negatively charged phosphate ions preferentially adsorb onto the positively charged c-surfaces. As a result, high phosphate concentration tends to form crystals with longer c-axis. Since the c-axis is preferentially oriented normal to the surface, the thickness of the films is increased.

Figure 29:
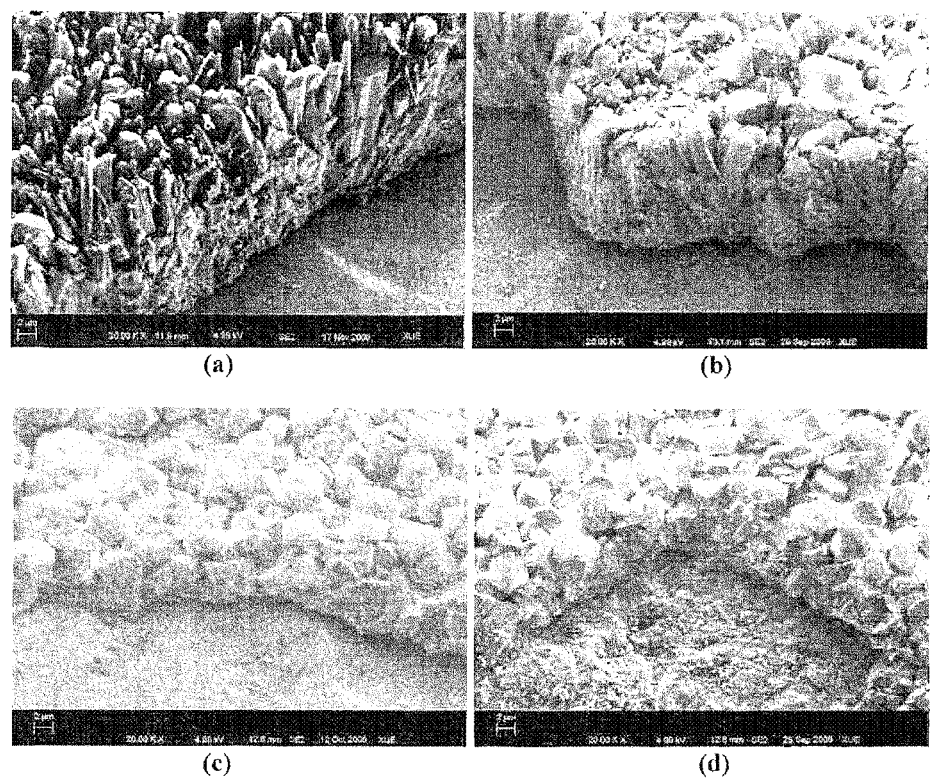
FIG. 29 shows side-view scanning electron microscopy images of high-density and gas-tight Y-HAP films located and formed upon a titanium substrate using a single hydrothermal deposition solution composition at a yttrium source material concentration of: (a) none; (b) 0.0067 M; (c) 0.02 M; and (d) 0.05 M, in accordance with the embodiments.

To investigate the effect of yttrium on the crystal growth, a series of experiments was undertaken with varying yttrium concentration in the starting hydrothermal deposition solutions while holding calcium concentration fixed at 0.1 M, and phosphate concentration fixed at 0.06 M. Again, the EDTA concentration was adjusted to ensure complete complexation of the cations according to the formula: [EDTA]=[Ca]+1.5 [Y]. A control experiment without the yttrium salt was also performed. After hydrothermal crystal growth for 15 hours at 200° C., the coatings exhibited a homogeneous coverage on all substrate surfaces and uniform thickness on each substrate. Without yttrium addition, HAP crystals in the coatings are rod-like in shape with the length of ~15 μm as shown in FIG. 29(a). Added yttrium promotes lateral intergrowth of crystals for creating a dense film. For example, the width of crystals without the yttrium addition is less than 2 μm, while those with 0.067 M yttrium in the starting solution are up to 6 μm, as illustrated in FIG. 29(b). This is possibly due to the strong adsorption affinity of yttrium ions to a-surfaces to promote growth of wider crystals. A study of hydroxyapatite doped with various ions has shown that Y-HAP can absorb a greater amount of calcium compared with both undoped and other ion substituted HAP. When starting yttrium content is less than 0.02 M, the obtained crystals are aligned and oriented with the c-axis normal to the substrate with the c-axis length greater than 10 μm, as shown in side view images in FIG. 27(b) and FIG. 28(b). However, as [Y] was increased to 0.02 M, a remarkable morphology change in the coatings was observed. The films are about ~2 μm thick, containing interconnected crystals with a well-defined hexagonal habit, but the c-axes of the hexagonal crystals are no longer vertically aligned, as shown in FIG. 29(c) and FIG. 29(d). The morphological changes in the Y-HAP films may result from the different positions of Y in the crystal framework when yttrium concentration is varied. There are two nonequivalent Ca sites available for cation substitution in an apatite unit cell. Ca(I) is positioned on the three fold axis and is surrounded by nine phosphate oxygen atoms, and Ca(II) is at the apex of staggered equilateral triangles surrounded by seven oxygen atoms. It has been reported that at low doping levels the Y cations are randomly distributed among these two type sites, while at the high substitution levels, they go preferentially to the Ca(II) site. The location of yttrium in the crystal framework will influence the growth rate of different facets to regulate the crystal morphology.

Figure 30:
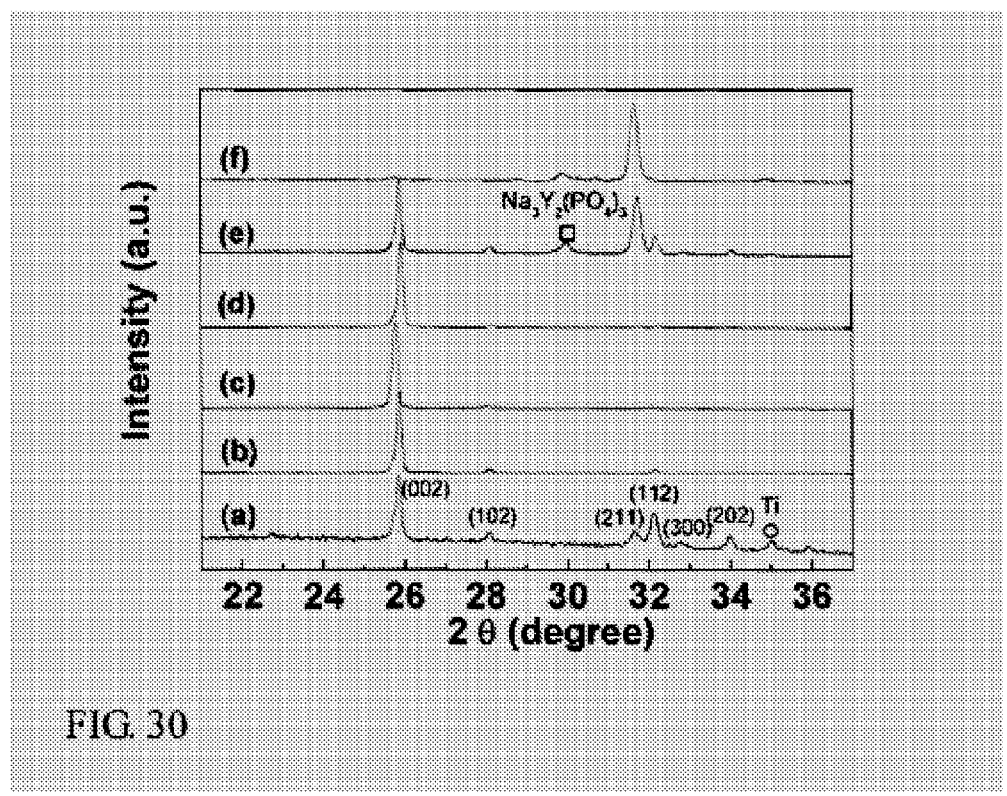
FIG. 30 shows a series of x-ray diffraction pattern images for HAP and Y-HAP films located and formed upon a titanium substrate including: (a) HAP seeds; (b) a high-density gas-tight HAP film without Y; (c) a high-density gas-tight Y-HAP film deposited using 0.0067 M yttrium source material; (d) a high-density gas-tight Y-HAP film deposited using 0.01 M yttrium source material; (e) a Y-HAP film deposited using 0.02 M yttrium source material; (f) a Y-HAP film deposited using 0.05 M yttrium source material, in accordance with the embodiments.

X-ray diffraction confirms the morphological changes observed by SEM, as shown in FIG. 30. FIG. 30(a) shows the diffraction pattern of the seed layer. The diffraction peaks from the seed layer are consistent with HAP, and no secondary phases were observed. The ratio of the intensities of the (002) to the (300) plane is quite large compared to the standard ratio of the random HAP, which indicates a (002) (i.e., c-axis) preferred orientation normal to the titanium substrate. Some HAP seed crystals are also oriented in other directions since several other diffraction peaks are still observed in FIG. 30(a). This is in agreement with the cross-sectional observation as shown in FIG. 24(b). After hydrothermal deposition and growth, the diffraction peaks are apparently sharper and stronger compared to the crystals in the electrochemically deposited seed layer, which suggests a higher degree of crystallization. The most notable feature of the pattern after hydrothermal deposition and growth is the enhancement in the intensity of the peak at 2θ of 25.8° which corresponds to the (002) reflection. The enhanced (002) intensity indicates that the c-axes of crystals are dominantly oriented normal to the substrate, consistent with the SEM observation in FIG. 27(b), FIG. 29(a) and FIG. 29(b). The diffraction pattern in FIG. 30(b) is consistent with the preferred crystal orientation of the sample observed in FIG. 29(a). When the starting [Y] is less than 0.02 M, the substitution of Y for Ca does not change the hexagonal crystal structure and no impurity is present, according to the XRD patterns of FIG. 30(c) and FIG. 30(d). However, as the Y concentration increased to 0.02 M in accordance with FIG. 30(e) and FIG. 30(f), an enhancement in intensity of (211) diffraction peak is observed in the pattern, indicating the crystals grow along the (211) direction normal to the substrate. This is also in agreement with the morphological changes as observed in FIG. 29(c) and FIG. 29(d). The $Na_2Y_2(PO_4)_2$ phase appears in addition to the apatite phase when Y content is 0.02 M or greater, indicating that some excess $Y^{3+}$ did not substitute in the apatite structure and reacted directly with $PO_4^{3-}$.

Figure 31:
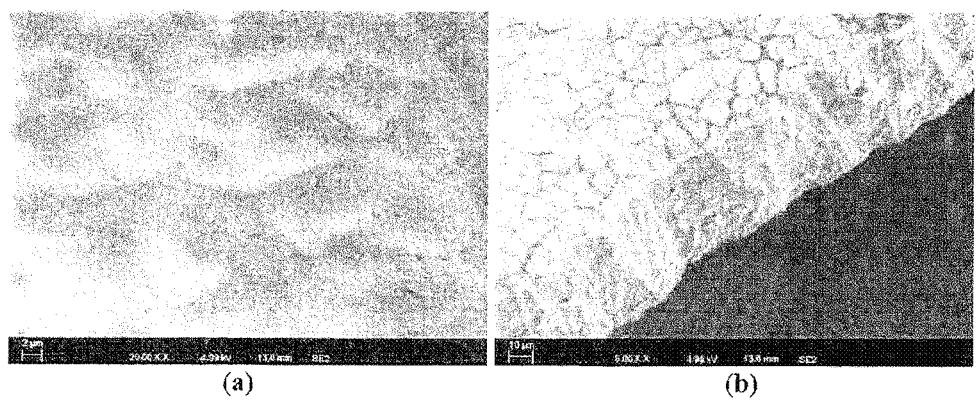
FIG. 31 shows: (a) top-view; and (b) side-view scanning electron microscopy images of a high-density gas-tight Y-HAP film located and formed upon a titanium substrate in accordance with the embodiments.

The effects of reagent concentrations, reaction time, and pH observed above were used as a guide to select conditions for growth of high-density gas-tight Y-HAP films. High calcium concentration and moderate yttrium concentration promotes lateral intergrowth of crystal domains, while high phosphate concentration promotes thicker films. Since growth kinetics slows after 15 hours, the hydrothermal deposition and growth step was repeated three times using a hydrothermal deposition solution containing 0.3 M $Ca(NO_3)_2$, 0.015 M $Y(NO_3)_3$, and 0.18 M $(NH_4)_2HPO_4$. Each growth step was carried out for 15 h at 200° C. with the starting pH of 10. After each step, the sample was taken out, rinsed with deionized water and then placed into a new reactant solution to resume the hydrothermal deposition reaction. The obtained Y-HAP film appears as a uniform and strongly adherent layer on the titanium substrate. SEM images in FIG. 31(a) and FIG. 31(b) show that all crystal domains grow together to form a high-density gas-tight Y-HAP film with a thickness approximately 40 μm. The x-ray diffraction pattern of this high-density and gas-tight Y-HAP film on the titanium substrate is the same as is shown in FIG. 21(b) for the high-density and gas-tight Y-HAP film located and formed upon the palladium substrate. The only visible diffraction peak is from the (002) planes, indicating that all crystals are near perfectly aligned with the c-axis normal to the titanium substrate. This is because the crystal growth in repeated reactions maintains the orientation of the original columnar crystals from the first hydrothermal deposition reaction. The preferentially oriented crystal domains substantially span the film thickness so that no misaligned crystals are detected in the diffraction pattern. The continuous Y-HAP films on titanium substrate can be potentially useful for orthopedic implants, particularly considering the enhanced osteoblast adhesion on Y-HAP compared with pure HAP. The crystal orientation is also ideal for electrically polarizing the crystal surfaces to further promote bone growth.

IX. High-Density and Gas-Tight CO$_3$-HAP Film on Titanium Substrate in Accordance with the Additional Embodiments

A. Film Deposition Materials and Methodology

NaCl (≥99.0% purity), tris(hydroxymethyl)-aminomethane (99.8+% purity), Ca(NO$_3$)$_2$.4H$_2$O (99.0% purity), and disodium ethylenediaminetetraacetate dehydrate (Na$_2$EDTA.2H$_2$O) (99.0-101.0% purity) were all obtained from Sigma-Aldrich. Urea (99.5% purity) and (NH$_4$)$_2$HPO$_4$ (>99.0% purity) were purchased from Fluka and EMD, respectively. K$_2$HPO$_4$ (99.99% purity), CaCl$_2$.2H$_2$O (99+% purity). 37% hydrochloride acid and 28.0-30.0% ammonium hydroxide were purchased from Mallinckrodt Chemicals. Titanium (Ti) (0.89 mm thick) foils were obtained from Alfa Aesar.

HAP seeds were electrochemically deposited onto a titanium substrate. A pre-cleaned titanium plate (12.5×12.5× 0.89 mm) was used as the cathode and the anode was a platinum plate (25×25×0.127 mm). The electrolyte solution consisted of 138 mM NaCl, 50 mM tris(hydroxymethyl)-aminomethane, 1.3 mM CaCl$_2$, 0.84 mM K$_2$HPO$_4$ in deionized water. The solution was buffered to pH 7.2 using 37% hydrochloride acid. The electrochemical reaction was carried out at ~95° C. for 5 min with constant current density of 12.5 mA/cm$^2$. After the deposition, the cathode electrode seeded with HAP crystals was taken out of the electrolyte solution, rinsed with deionized water several times, and dried in air.

The HAP seed layer seeded titanium substrate was submerged in a hydrothermal synthesis solution with the HAP seed layer facing down and tilted up at about 45 degrees relative to the bottom of a Teflon-lined vessel. For a typical hydrothermal solution, Na$_2$EDTA (0.115 M) was first completely dissolved into 30 ml deionized water, then Ca(NO$_3$)$_2$ (0.1 M), (NH$_4$)$_2$HPO$_4$ (0.06 M), and urea (0.2 M) were successively added and the solution was stirred for 30 min. The solution was then adjusted to pH 10.0 with ammonium hydroxide and transferred to a Teflon-lined vessel to immerse the seeded substrate. The Teflon-lined vessel was sealed in a stainless steel autoclave and put into a convective oven for the hydrothermal synthesis at 200° C. for 15 h. After the reaction, the autoclave was cooled to room temperature in air. The sample was taken out, rinsed with deionized water several times, and dried in air.

B. Physical and Chemical Analysis of CO$_3$-HAP Film on Titanium Substrate

The morphology of a resulting high-density and gas-tight CO$_3$-HAP film was examined using a field emission source scanning electron microscope (FESEM, Zeiss-Leo DSM982). The crystal structure was determined by X-ray diffraction (XRD) (Philips PW3020) with Cu Kα radiation (λ=1.5418 Å) in the 2θ range from 20° to 60°. The Fourier transform infrared (FTIR) spectra were obtained using a spectrophotometer (FTIR-8400S Shimadzu) in a range of 500-2000 cm$^{-1}$.

C. Results and Discussion

Figure 32:
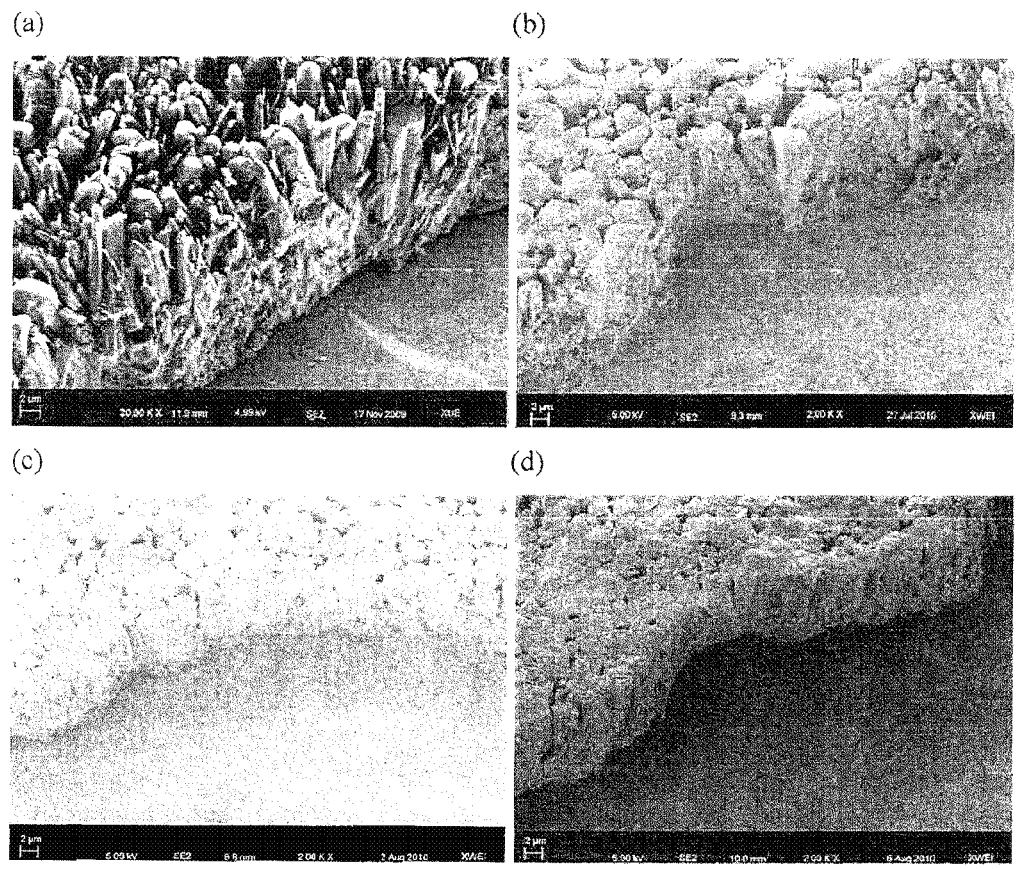
FIG. 32 shows side-view scanning electron microscopy images of HAP and $CO_3$-HAP films located and formed upon a titanium substrate using a single hydrothermal deposition solution composition including a urea concentration of: (a) no urea; (b) 0.1 M; (c) 0.2 M; and (d) 0.3 M, in accordance with the embodiments.

Hydrothermal crystal growth onto the seeded substrate was carried out in a synthetic mixture containing calcium nitrate, ammonium hydrogen phosphate and urea. Surface crystallization onto the HAP seed layer seeded titanium substrate was carried out by hydrothermal decomposition of urea and calcium-EDTA chelates in a phosphate containing solution. To investigate the effect of urea on the resulting high-density and gas-tight CO$_3$-HAP crystal morphology, a series of experiments was undertaken with varying urea concentration in the hydrothermal deposition solution chemical composition. FIG. 32 shows the side-view scanning electron microscopy images of the obtained high-density and gas-tight CO$_3$-HAP films. Hexagonal facets of crystals are clearly visible after the hydrothermal process. Comparing the scanning electron microscopy images it may be observed that urea functions effectively to slow crystal growth on the c-axis and promote a-axis growth of a high-density and gas-tight CO$_3$-HAP film. As shown in FIG. 32(a), without the addition of urea the film thickness is ~17 μm and many gaps between crystals can be observed. When 0.1 M urea was added to the hydrothermal deposition solution composition, most crystal domains grow together and the obtained film is about 9 μm thick, as illustrated in FIG. 32(b). As the urea concentration is increased to 0.2 M, the density of the CO$_3$-HAP film increased and the thickness was further reduced to 6 μm, as illustrated in FIG. 32(c). However, there was no obvious further change in morphology when the urea content increased to 0.3 M in the hydrothermal deposition solution composition, as illustrated in FIG. 32(d).

Figure 33:
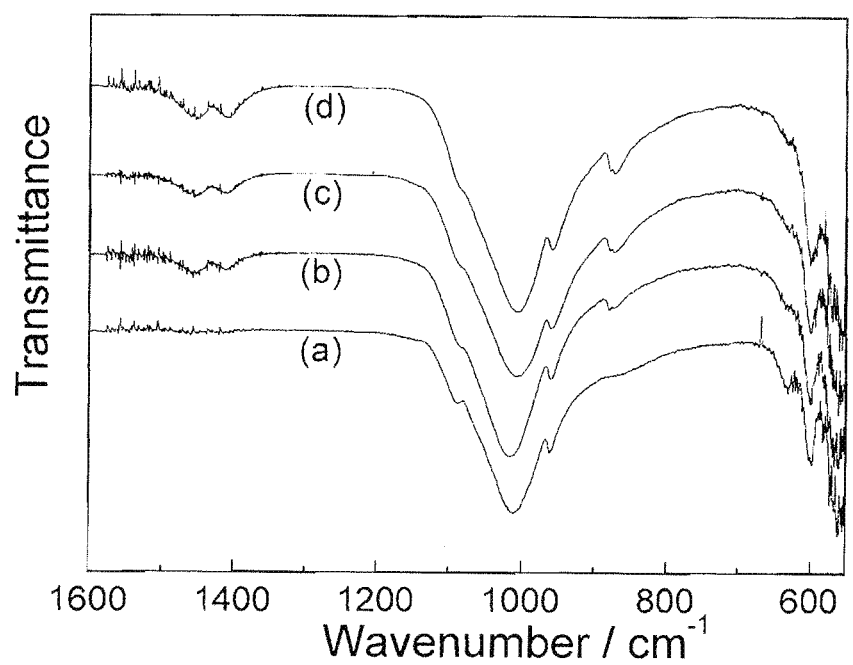
FIG. 33 shows a series of fourier transform infrared spectra images of HAP and $CO_3$-HAP films located and formed upon a titanium substrate using a single hydrothermal deposition solution composition including a urea concentration of: (a) no urea; (b) 0.1 M; (c) 0.2 M; and (d) 0.3 M, in accordance with the embodiments.

Fourier transform infrared spectroscopy spectra of obtained CO$_3$-HAP films are illustrated in FIG. 33, where the separate curves (a), (b), (c) and (d) correspond with the HAP films and CO$_3$-HAP films as illustrated within the scanning electron microscopy images of FIG. 32(a), FIG. 32(b), FIG. 32(c) and FIG. 32(d). The absorption bands observed at 958 cm$^{-1}$, 1005 cm$^{-1}$ and 1088 cm$^{-1}$ correspond with the PO$_4^{3-}$ group. The vibration of OH$^{-1}$ groups appears at 631 cm$^{-1}$. For the sample prepared without urea addition (i.e., FIG. 33(a)), no obvious absorption peak was found in the range of 1400-1600 cm$^{-1}$, indicating that the sample does not contain large quantities of carbonate ions. For the remaining samples prepared in the presence of urea, additional peaks for the CO$_3^{2-}$ group appear at 872 cm$^{-1}$, 1408 cm$^{-1}$ and 1453 cm$^-$, indicating that the as-prepared films are mainly B-type carbonated HAP. The fourier transform infrared spectroscopy spectra also show that with increasing a concentration of urea, the absorption bands of PO$_4^{3-}$ at 1088 cm$^{-1}$ weaken, while those of CO$_3^{2-}$ strengthen, which implies that the amount of carbonate in the HAP lattice increases.

It was found the addition of urea did not have a great influence on pH value of the hydrothermal solutions. For all samples the initial pH was 10 while after hydrothermal reaction it became ~9.6. Therefore, one may infer that the urea induced morphology change is a result of the CO$_3^{2-}$ incorporation into the hydroxyapatite crystals during hydrothermal reaction, in which the carbonate ions are released by urea decomposition. HAP has two types of crystal planes, i.e., a positively charged calcium rich a-plane and a negatively charged hydroxyl and phosphate rich c-plane. The fourier transform infrared spectrum analysis has shown that carbonate ions mainly occupy the phosphate sites, as a result, the existence of CO$_3^{2-}$ on the c-plane attracts more Ca$^{2+}$ to this surface due to the strong interaction between Ca$^{2+}$ and CO$_3^{2-}$ and consequently promotes the crystal growth along the a-axis (c-plane). The inhibited crystal growth along c-axis is probably due to the lack of Ca$^{2+}$ around a-planes.

Figure 34:
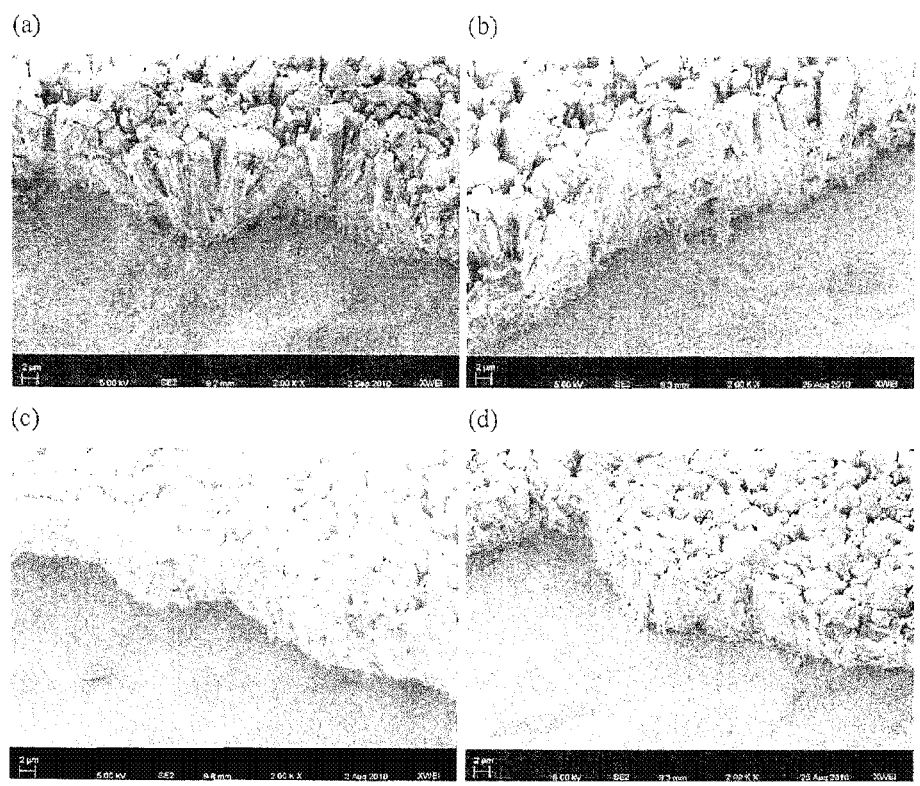
FIG. 34 shows side-view scanning electron microscopy images of a $CO_3$-HAP films located and formed upon a titanium substrate using a single hydrothermal deposition solution composition at a pH value of: (a) 7; (b) 9; (c) 10; and (d) 10.5, in accordance with the embodiments.

Side-view scanning electron microscopy images of CO$_3$-HAP films obtained under different solution pH conditions are shown in FIG. 34. The obtained films show similar morphology when the pH varied from 7 to 9, as shown in FIG. 34(a) and FIG. 34(b), respectively. Further increase of the pH results in a remarkable change in crystal morphology. As shown in FIG. 34(c), the film obtained at pH 10 is much denser and thinner than that prepared at pH 9, however, the film density was decreased while the thickness remaining unchanged as the pH increased from 10 to 10.5, as shown in FIG. 34(d). This is also can be attributed to the CO$_3^{2-}$ incorporation, since it has been reported that pH plays an important role on the incorporation of CO$_3^{2-}$ into the HAP lattice with the maximum incorporation occurring around pH 10. The $CO_3^{2-}$ incorporation can effectively slow crystal growth on the c-axis and promote a-axis growth, therefore, pH 10 is the optimum condition that is favorable for the a-axis growth relative to the c-axis for creating a high-density and gas-tight $CO_3$-HAP film.

Figure 35:
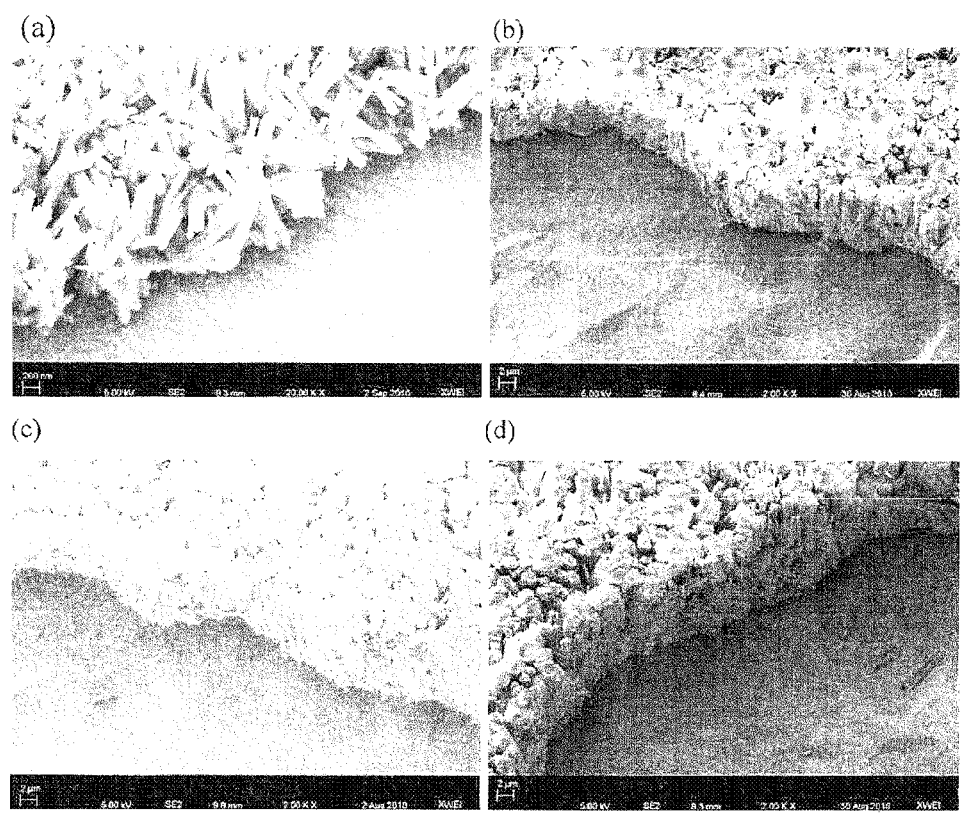
FIG. 35 shows side-view scanning electron microscopy images of $CO_3$-HAP films located and formed upon a titanium substrate using a single hydrothermal deposition solution composition at hydrothermal reaction temperatures of: (a) 150; (b) 180; (c) 200; and (d) 220 degrees centigrade, in accordance with the embodiments.

Temperature is a critical factor influencing the crystal morphology in the hydrothermal process. Upon heating the solution, both urea and the Ca-EDTA decompose to release $CO_3^{2-}$ and $Ca^{2+}$ into the phosphate containing solution. As the solution becomes supersaturated, the HAP seed layer crystals start to grow with the carbonate substitution. FIG. 35 shows the side-view scanning electron microscopy images illustrating morphology of $CO_3$-HAP films deposited under different reaction temperatures. As shown in FIG. 35(a), the $CO_3$-HAP film crystals obtained at 150° C. still have needle-like morphology, similar to those that comprise a HAP seed layer. This observation may suggest that 150° C. may be too low for the decomposition of a calcium EDTA complex. The crystals size increased remarkably as the temperature was increased to 180° C., as illustrated in FIG. 35(b). The resulting $CO_3$-HAP film contained well-developed hexagonal crystals with a width up to 2 μm and a length of ~5 μm. With increasing temperature to 200° C. and 220° C., more reactants may precipitate at the substrate surface so that film thickness is increased, as illustrated in FIG. 35(c) and FIG. 35(d).

Figure 36:
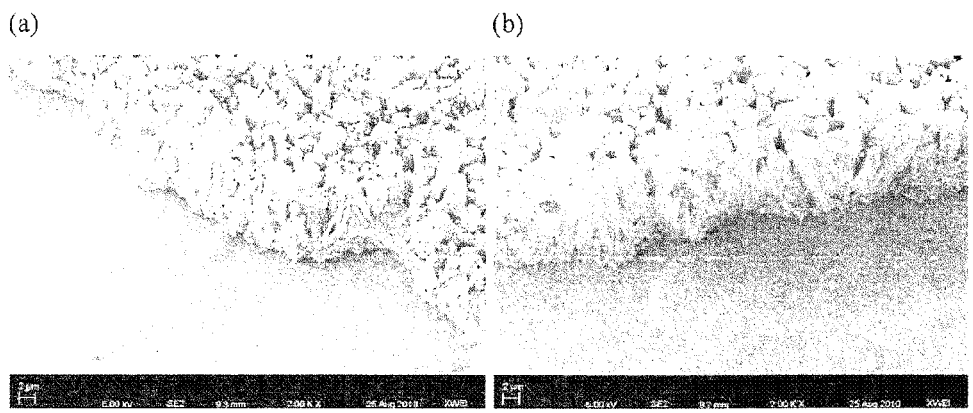
FIG. 36 shows side-view scanning electron microscopy images of $CO_3$-HAP films located and formed upon a titanium substrate using a single hydrothermal deposition solution composition at hydrothermal reaction times of: (a) 5 hours; and (b) 10 hours, in accordance with the embodiments.
Figure 37:
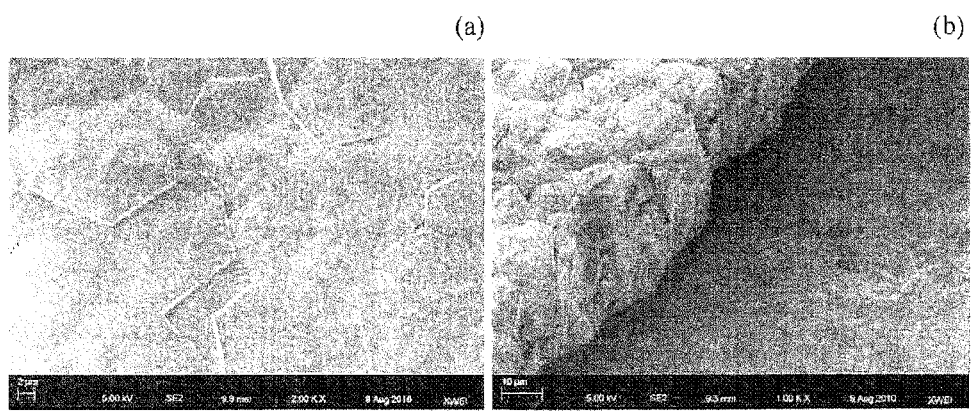
FIG. 37 shows: (a) top-view; and (b) side-view scanning electron microscopy images of $CO_3$-HAP films located and formed upon a titanium substrate using a single hydrothermal deposition solution to provide high-density and gas-tight $CO_3$-HAP films in accordance with the embodiments.

The influence of the reaction time on the film morphology is illustrated in FIG. 36. $CO_3$-HAP crystals grow in 10 hours as illustrated in FIG. 36(b) are bigger in width with similar length as those in 5 hours, as illustrated in FIG. 36(a). A further increase of the reaction time to 15 hours does not result in an obvious increase in crystal size in terms of width and length, possibly indicating the entire crystal growth and competing crystal dissolution reach equilibrium after 10 hours. The crystal growth is fast in the initial stage of the reaction, while the growth slows down with reaction time. The crystal growth rate varies at different direction. It is anticipated that the c-axis is the fastest growing dimension in apatite structure. As a result, crystal growth and crystal dissolution along c-axis may reach equilibrium after 5 hours, while a corresponding crystal growth and crystal dissolution equilibrium along the a-axis may need a longer time to develop To obtain a high-density and gas-tight film, the hydrothermal growth step for a $CO_3$-HAP film was repeated 4 times. Each growth step was undertaken for 10 hours at 200° C. Top-view and side-view scanning electron microscopy images are shown in FIG. 37(a) and FIG. 37(b) respectively, which show that all crystal domains grow together to form a sufficiently gas-tight film with the thickness approximately 25 μm. This process of depositing a high-density and gas-tight $CO_3$-HAP film located and formed upon a titanium substrate is also presumably reproducible on other metal substrates, such as but not limited to palladium substrates and stainless steel substrates.

Figure 38:
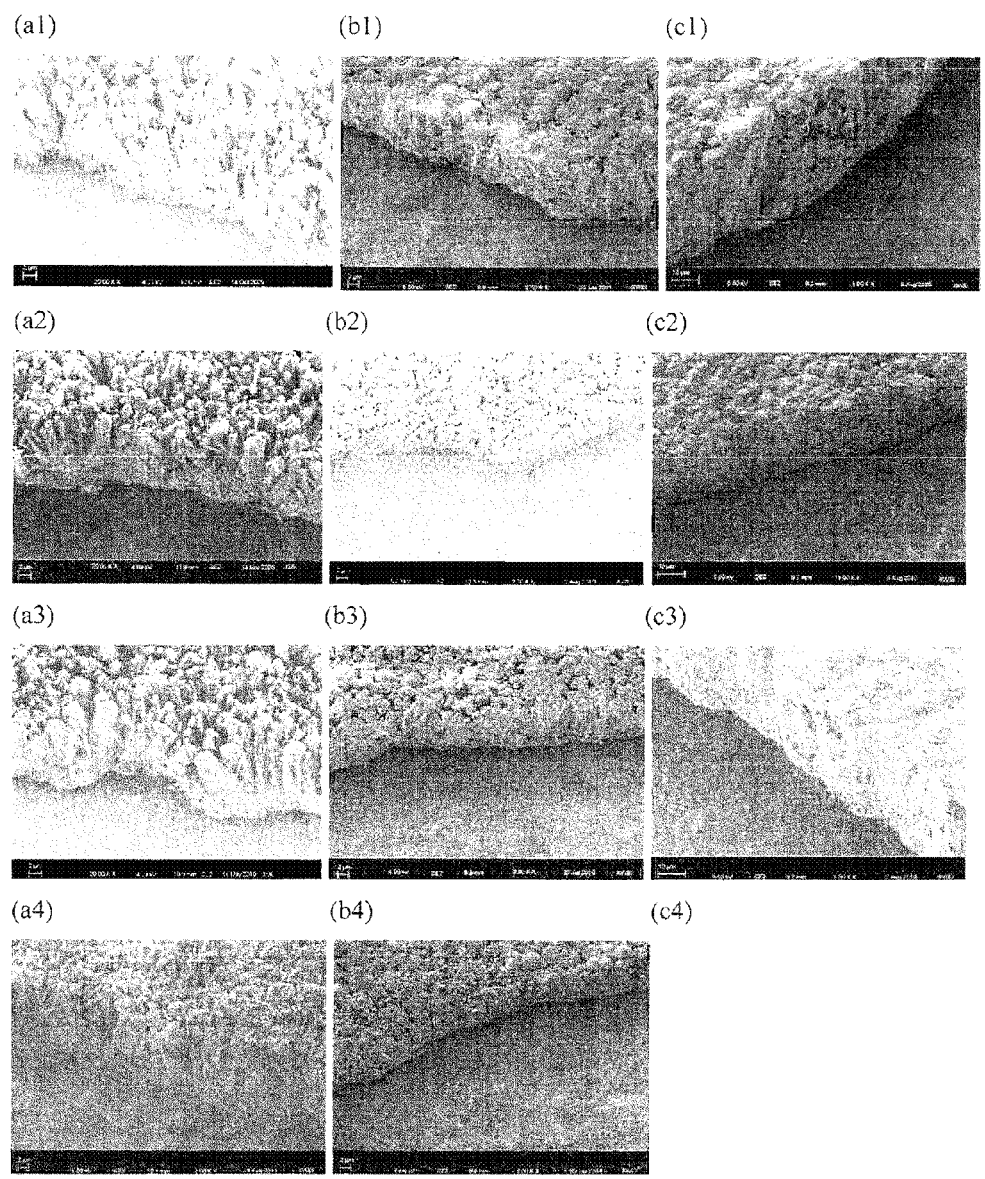
FIG. 38 shows side-view scanning electron microscopy images of apatite films located and formed upon a titanium substrate using an electrochemical deposition method and hydrothermal deposition method in accordance with the embodiments and including: (a1) K-HAP film deposited for 15 hours; (b1) $KCO_3$-HAP film deposited for 15 hours; (c1) $KCO_3$-HAP film deposited for 40 hours; (a2) Mg-HAP film deposited for 15 hours; (b2) $MgCO_3$-HAP film deposited for 15 hours; (c2) $MgCO_3$-HAP film deposited for 40 hours; (a3) La-HAP film deposited for 15 hours; (b3) $LaCO_3$-HAP film deposited for 15 hours; (c3) $LaCO_3$-HAP film deposited for 40 hours; (a4) F-HAP film deposited for 15 hours; (b4) $FCO_3$-HAP film deposited for 15 hours.
Figure 39:
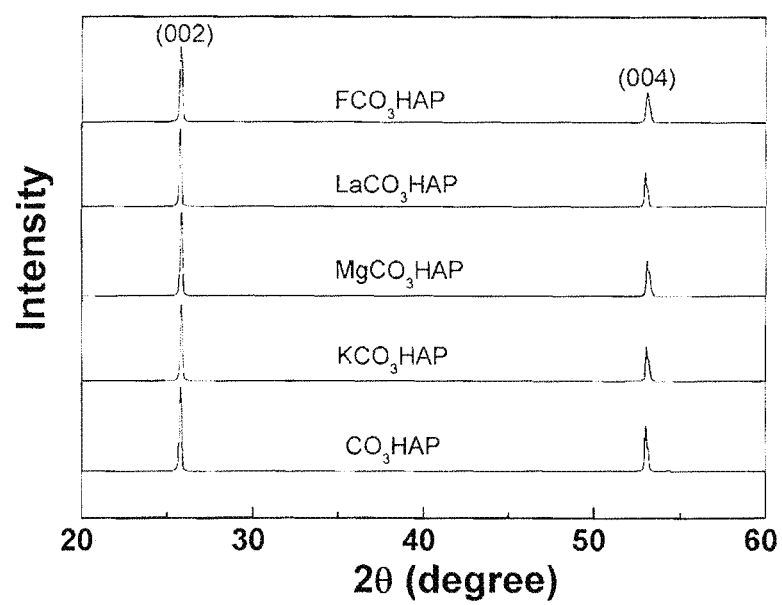
FIG. 39 shows powder x-ray diffraction spectra of $CO_3$-HAP, $KCO_3$-HAP, $MgCO_3$-HAP, $LaCO_3$-HAP and $FCO_3$-HAP films located and formed upon a titanium substrate using a single hydrothermal deposition solution composition in a range of 2θ from 20 to 60 degrees, in accordance with the embodiments.

Numerous high-density and gas-tight apatite films with different chemical compositions may also be formed by the sequential electrochemical HAP seed layer deposition method and hydrothermal high-density and gas-tight layer deposition process with urea to adjust the crystal growth. Various salts were added to the hydrothermal deposition solution composition, and the ions of these salts could substitute for calcium and hydroxyl ions in the apatite films. Particular resulting high-density and gas-tight HAP films included: K-HAP, Mg-HAP, La-HAP, F-HAP and related carbonated derivatives as illustrated in FIG. 38 and described more completely and specifically in the Detailed Description of the Drawings above. For example, a dense Mg containing carbonated apatite ($MgCO_3$-HAP) film as shown in FIG. 38(c2) was obtained by repeating the hydrothermal step 4 times using a hydrothermal deposition solution composition containing 0.1 M $Ca(NO_3)_2$, 0.01 M $Mg(NO_3)_2$, 0.115 M $Na_2EDTA$, 0.06M $(NH_4)_2HPO$ and 0.2 M urea. Each deposition and growth step was carried out for 10 hours at 200° C. As shown in FIG. 38(b1), $Mg^{2+}$ has a marked inhibitory effect on crystal growth along c-axis. As a result, the obtained dense film is ~17 μm thick. Using similar deposition methodology approach, high-density and gas-tight films of potassium containing carbonated apatite ($KCO_3$-HAP) (FIG. 38(c1), lanthanum containing carbonated apatite ($LaCO_3$-HAP) (FIG. 22(c3) and fluoride containing carbonated apatite ($FCO_3$-HAP) (not shown) were obtained. X-ray diffraction patterns of the high-density and gas-tight carbonated apatite films are shown in FIG. 39. The only visible (002) and (004) diffraction peaks indicates that all crystals are near perfectly aligned with the c-axis normal to the substrate.

Various carbonated apatite films with preferential c-axis orientation were prepared by a sequential electrochemical methodology and hydrothermal methodology deposition technique. The technique includes an electrochemical methodology reaction to deposit a HAP seed layer upon a substrate and a subsequent hydrothermal methodology method to deposit a high-density and gas-tight layer upon the substrate and the seed layer. The presence of urea in the hydrothermal process supplied $CO_3^{2-}$ which was incorporated into the crystal lattice. The $CO_3^{2-}$ incorporation adjusted the crystal morphology by effectively slowing crystal growth on the c-axis and promoting a-axis growth. Spectroscopic analysis indicates that the as-prepared samples are B-type carbonated apatites, in which carbonate ions occupy the phosphate sites. Investigation of the influence of the temperature and duration of the hydrothermal treatment as well as the initial pH value on the morphology of the product has resulted in the optimization of the deposition conditions, leading to the well intergrown, highly oriented and continuous high-density and gas-tight films after repeated hydrothermal deposition process steps. These novel structured apatite films are potentially useful for biomaterials and catalysts, as well as electronic and electrochemical devices, such as but not limited to fuel cells and chemical sensors.

Having thus described the various embodiments of the invention, it will be apparent to those skilled in the art that the foregoing detailed disclosure is presented by way of example only and thus is not limiting. Various alterations, improvements and modifications recognized by those skilled in the art, though not expressly stated herein, may be made and are intended to be within the spirit and scope of the claimed invention.

Additionally, the recited order of processing elements or sequences, or the use of numbers, letters, or other designations, is not intended to limit the claimed processes to any order except as may be specified in the claims. Accordingly, embodiments of the invention are limited only by the following claims and equivalents thereto.

We claim:

1. A film composition comprising:
a crystalline proton and/or ion conducting film having a thickness, wherein the crystalline proton and/or ion conducting film is characterized by a plurality of single carbonated apatite crystals each having a c-axis normal to a surface of the film composition, further wherein the film composition is a gas-tight film composition where each of the plurality of single carbonated apatite crystals has a crystal domain that substantially spans the thickness of the crystalline proton and/or ion conducting film.

2. The film composition of claim 1 wherein the crystalline proton and/or ion conducting film is characterized by an x-ray diffraction pattern having substantially only a (002) reflection peak in a 2Θ range of +/−20 to 40 degrees.

3. The film composition of claim 1 wherein the film composition comprises a free standing membrane.

4. The film composition of claim 1 wherein the film composition is located supported upon a substrate.

5. The film composition of claim 4 wherein the substrate comprises a material selected from the group consisting of conductor materials, semiconductor materials and dielectric materials.

6. The film composition of claim 1 wherein the plurality of single carbonated apatite crystals is not further doped.

7. The film composition of claim 1 wherein the plurality of single carbonated apatite crystals is further doped.

8. The film composition of claim 7 wherein the plurality of single carbonated apatite crystals is further doped with a dopant selected from the group consisting of potassium, magnesium, lanthanum and fluorine dopants.

9. A fuel cell comprising:
an anode separate from a cathode; and
a crystalline proton and/or ion conducting film interposed between the anode and the cathode and having a thickness, wherein the crystalline proton and/or ion conducting film is characterized by a plurality of single carbonated apatite crystals each having a c-axis normal to a surface of the film composition, further wherein the film composition is a gas-tight film composition where each of the plurality of single carbonated apatite crystals has a crystal domain that substantially spans the thickness of the crystalline proton and/or ion conducting film.

10. The fuel cell of claim 9 wherein the crystalline proton and/or ion conducting film is characterized by an x-ray diffraction pattern having substantially only a (002) reflection peak in a 2Θ range of +/−20 to 40 degrees.

* * * * *

UNITED STATES PATENT AND TRADEMARK OFFICE
CERTIFICATE OF CORRECTION

PATENT NO.         : 8,916,311 B2                                    Page 1 of 1
APPLICATION NO.    : 13/213566
DATED              : December 23, 2014
INVENTOR(S)        : Matthew Yates et al.

It is certified that error appears in the above-identified patent and that said Letters Patent is hereby corrected as shown below:

In the Specification

Column 1, line 20, delete "Nos." and insert --No.--;
         line 20, delete "and DE-FC03-";
         line 21, delete "92SF19460".

Signed and Sealed this
Twenty-first Day of April, 2015

Michelle K. Lee
*Director of the United States Patent and Trademark Office*